(12) United States Patent
Onodera et al.

(10) Patent No.: US 10,622,150 B2
(45) Date of Patent: Apr. 14, 2020

(54) ELECTRONIC COMPONENT AND ELECTRONIC COMPONENT DEVICE

(71) Applicant: TDK CORPORATION, Tokyo (JP)

(72) Inventors: Shinya Onodera, Tokyo (JP); Takehisa Tamura, Tokyo (JP); Atsushi Takeda, Tokyo (JP); Ken Morita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 38 days.

(21) Appl. No.: 16/166,629

(22) Filed: Oct. 22, 2018

(65) Prior Publication Data

US 2019/0131073 A1 May 2, 2019

(30) Foreign Application Priority Data

Oct. 30, 2017 (JP) .................. 2017-209404

(51) Int. Cl.
*H01G 4/232* (2006.01)
*H01G 4/248* (2006.01)
*H01G 4/30* (2006.01)
*H01G 4/012* (2006.01)
*H01G 4/12* (2006.01)
*H05K 1/11* (2006.01)
*H05K 1/18* (2006.01)

(52) U.S. Cl.
CPC .......... *H01G 4/2325* (2013.01); *H01G 4/012* (2013.01); *H01G 4/232* (2013.01); *H01G 4/248* (2013.01); *H01G 4/30* (2013.01); *H01G 4/1227* (2013.01); *H01G 4/1245* (2013.01); *H05K 1/111* (2013.01); *H05K 1/181* (2013.01); *H05K 2201/10015* (2013.01)

(58) Field of Classification Search
None
See application file for complete search history.

(56) References Cited

U.S. PATENT DOCUMENTS

| 6,381,117 B1* | 4/2002 | Nakagawa | H01G 2/14 361/301.4 |
| 8,988,856 B2* | 3/2015 | Oh | H01G 4/008 361/301.4 |
| 10,032,559 B2* | 7/2018 | Ando | H01G 4/30 |

(Continued)

FOREIGN PATENT DOCUMENTS

| JP | H8-107038 A | 4/1996 | |
| JP | 2010226017 | * 7/2010 | ............... H01G 4/12 |

*Primary Examiner* — Dion Ferguson
(74) *Attorney, Agent, or Firm* — Oliff PLC

(57) ABSTRACT

An element body of a rectangular parallelepiped shape includes first and second principal surfaces opposing each other in a first direction, a pair of side surfaces opposing each other in a second direction, and a pair of end surfaces opposing each other in a third direction. An external electrode disposed at an end portion of the element body in the third direction. The external electrode includes a first conductive resin layer and a second conductive resin layer. The first conductive resin layer continuously covers one part of the first principal surface, one part of the end surface, and one part of each of the pair of side surfaces. The second conductive resin layer is separated from the first conductive resin layer, and continuously covers one part of the second principal surface, one part of the end surface, and one part of each of the pair of side surfaces.

12 Claims, 14 Drawing Sheets

(56) References Cited

U.S. PATENT DOCUMENTS

| | | | | |
|---|---|---|---|---|
| 2013/0170095 A1* | 7/2013 | Oh | ........................ | H01G 4/008 |
| | | | | 361/305 |
| 2017/0154729 A1* | 6/2017 | Lee | ........................ | H01G 4/012 |
| 2017/0186538 A1* | 6/2017 | Ando | .................... | H01G 4/2325 |
| 2017/0294268 A1* | 10/2017 | Katsuta | .................. | H01G 4/012 |
| 2018/0068792 A1* | 3/2018 | Egashira | ................. | H01B 1/02 |
| 2019/0237259 A1* | 8/2019 | Onodera | .................. | H01G 4/30 |

\* cited by examiner

… … …
ELECTRONIC COMPONENT AND ELECTRONIC COMPONENT DEVICE

BACKGROUND OF THE INVENTION

1. Field of the Invention

The present invention relates to an electronic component and an electronic component device.

2. Description of Related Art

Known electronic components include an element body of a rectangular parallelepiped shape and a plurality of external electrodes (see, for example, Japanese Unexamined Patent Publication No. H8-107038). The element body includes a pair of principal surfaces opposing each other, a pair of end surfaces opposing each other, and a pair of side surfaces opposing each other. The plurality of external electrodes is disposed at each end portion of the element body in a direction in which the pair of end surfaces opposes each other. The external electrode includes a conductive resin layer. The conductive resin layer continuously covers the entire end surface, one part of each of the principal surfaces, and one part of each of the pair of side surfaces.

SUMMARY OF THE INVENTION

An object of one aspect of the present invention is to provide an electronic component that suppresses occurrence of a crack in an element body and improves moisture resistance reliability. An object of another aspect of the present invention is to provide an electronic component device that suppresses occurrence of a crack in an element body and improves moisture resistance reliability.

An electronic component according to one aspect includes an element body of a rectangular parallelepiped shape and a plurality of external electrode. The element body includes first and second principal surfaces opposing each other in a first direction, a pair of side surfaces opposing each other in a second direction, and a pair of end surfaces opposing each other in a third direction. The plurality of external electrodes is disposed at both end portions of the element body in the third direction. Each of the external electrodes includes a first conductive resin layer and a second conductive resin layer. The first conductive resin layer continuously covers one part of the first principal surface, one part of the end surface, and one part of each of the pair of side surfaces. The second conductive resin layer is separated from the first conductive resin layer, and continuously covers one part of the second principal surface, one part of the end surface, and one part of each of the pair of side surfaces.

In a case in which the electronic component is solder-mounted on an electronic device, external force applied onto the electronic component from the electronic device may act as stress on the element body. The electronic device includes, for example, a circuit board or an electronic component. The external force acts on the element body from a solder fillet formed at the solder-mounting, through the external electrode. In this case, a crack may occur in the element body. The external force tends to act on a region defined by one part of the principal surface arranged to constitute a mounting surface, one part of the end surface, and one part of the pair of side surfaces, in the element body.

In the one aspect, the first conductive resin layer continuously covers the one part of the first principal surface, the one part of the end surface, and the one part of each of the pair of side surfaces, and the second conductive resin layer continuously covers the one part of the second principal surface, the one part of the end surface, and the one part of each of the pair of side surfaces. Therefore, in either case in which the first principal surface or the second principal surface is arranged to constitute the mounting surface, the external force applied onto the electronic component from the electronic device tends not to act on the element body. Consequently, the one aspect suppresses occurrence of a crack in the element body.

In a case in which an element is described as covering another element, the element may directly cover the other element or indirectly cover the other element.

A region between the element body and the conductive resin layer may include a path through which moisture infiltrates. In a case in which moisture infiltrates from the region between the element body and the conductive resin layer, durability of the electronic component decreases. The one aspect includes few paths through which moisture infiltrates, as compared with a configuration in which the conductive resin layer covers the entire end surface, one part of each of the principal surfaces, and one part of each of the pair of side surfaces. Therefore, the one aspect improves moisture resistance reliability.

The one aspect may be mounted on the electronic device in such a manner that the first principal surface is arranged to constitute the mounting surface, or may be mounted on the electronic device in such a manner that the second principal surface is arranged to constitute the mounting surface. Therefore, the one aspect has no directionality at the mounting of the electronic component, and improves workability of mounting.

The one aspect may include an internal conductor exposed to a corresponding end surface of the pair of end surfaces. Each of the external electrodes may include a sintered metal layer formed on the end surface to be connected to the internal conductor. In this configuration, the external electrode is favorably in contact with the internal conductor. Therefore, this configuration allows reliable electrical connection between the external electrode and the internal conductor.

In the one aspect, the sintered metal layer may include a first region covered with the first conductive resin layer, a second region covered with the second conductive resin layer, and a third region exposed from the first conductive resin layer and the second conductive resin layer. For example, each of the first and second conductive resin layers includes a conductive material and a resin. The conductive material includes, for example, metal powder. The resin includes, for example, a thermosetting resin. Electric resistance of each of the first and second conductive resin layers is larger than electric resistance of the sintered metal layer. In a case in which the sintered metal layer includes the third region, the third region is electrically connected to the electronic device without passing through the first and second conductive resin layers. Therefore, this configuration suppresses an increase in equivalent series resistance (ESR) even in a case in which the external electrode includes the first and second conductive resin layers.

In the one aspect, each of the external electrodes may include a plating layer covering the first conductive resin layer, the second conductive resin layer, and the third region of the sintered metal layer. In this configuration, the external electrode includes the plating layer, and thus the electronic component can be solder-mounting on the electronic device. The third region of the sintered metal layer is electrically connected to the electronic device via the plating layer. Therefore, this configuration further suppresses the increase in the ESR.

In the one aspect, the sintered metal layer may cover a ridge portion located between the end surface and the side surface. A portion of the sintered metal layer formed on the ridge portion may be partially exposed from the first and second conductive resin layers. This configuration further suppresses the increase in the ESR.

In the one aspect, when viewed from the third direction, an interval between the first conductive resin layer and the second conductive resin layer in the first direction may be larger than respective heights of the first and second conductive resin layers in the first direction. This configuration further suppresses the increase in the ESR.

In the one aspect, when viewed from the third direction, respective heights of the first and second conductive resin layers in the first direction may be larger than an interval between the first conductive resin layer and the second conductive resin layer in the first direction. This configuration reliably suppresses the occurrence of a crack in the element body.

In the one aspect, when viewed from the third direction, the respective heights of the first and second conductive resin layers in the first direction may be larger at an end in the second direction than at a center in the second direction. In this configuration, the first and second conductive resin layers tend not to peel off from the element body.

An electronic component device according to another aspect includes the electronic component and an electronic device including a plurality of pad electrodes. Each of the plurality of external electrodes is connected to a corresponding pad electrode of the plurality of pad electrodes via a solder fillet.

As described above, the other aspect suppresses occurrence of a crack in the element body, and improves moisture resistance reliability.

In the other aspect, the electronic component may include an internal conductor exposed to a corresponding end surface of the pair of end surfaces. The external electrode may include a sintered metal layer formed on the end surface to be connected to the internal conductor. The sintered metal layer may include a first region covered with the first conductive resin layer, a second region covered with the second conductive resin layer, and a third region exposed from the first conductive resin layer and the second conductive resin layer. The solder fillet may overlap the third region of the sintered metal layer when viewed from the third direction. In this configuration, the third region is electrically connected to the electronic device via a solder fillet. The third region is electrically connected to the electronic device without passing through the first and second conductive resin layers. Therefore, this configuration suppresses an increase in ESR even in a case in which the external electrode includes the first and second conductive resin layers.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
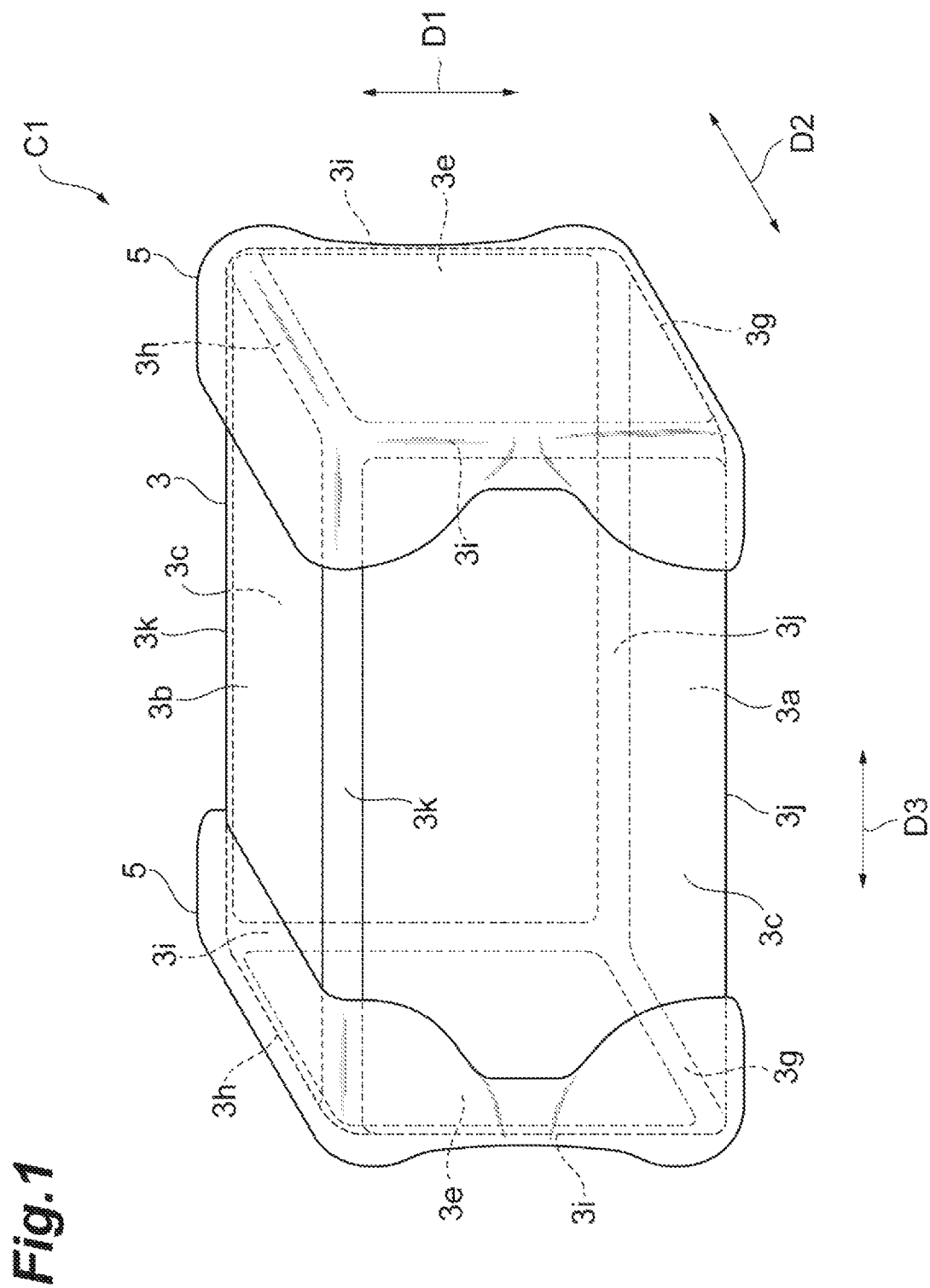
FIG. 1 is a perspective view of a multilayer capacitor according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
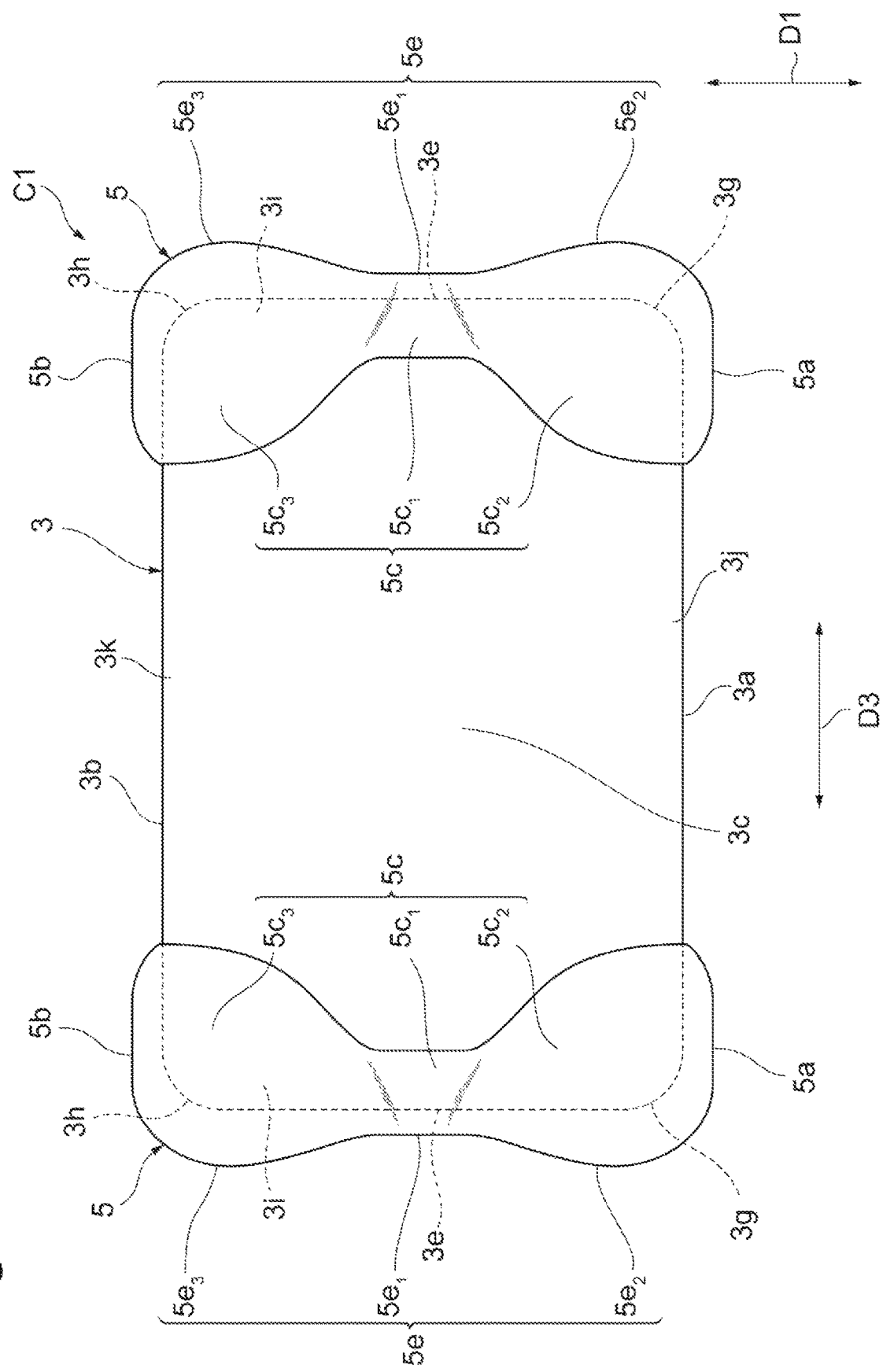
FIG. 2 is a side view of the multilayer capacitor according to the embodiment.
Figure 3:
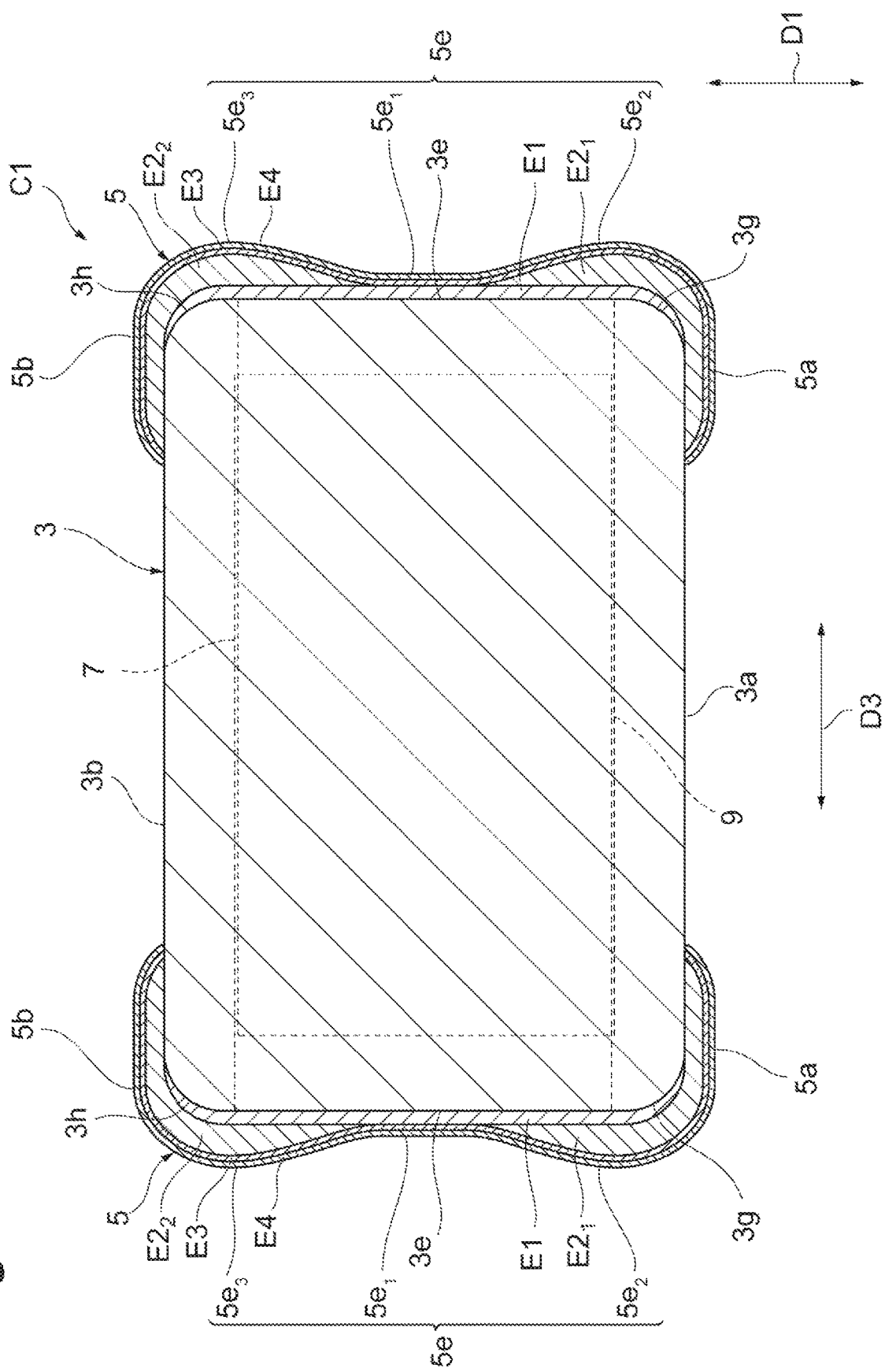
FIG. 3 is a view illustrating a cross-sectional configuration of the multilayer capacitor according to the embodiment.
Figure 4:
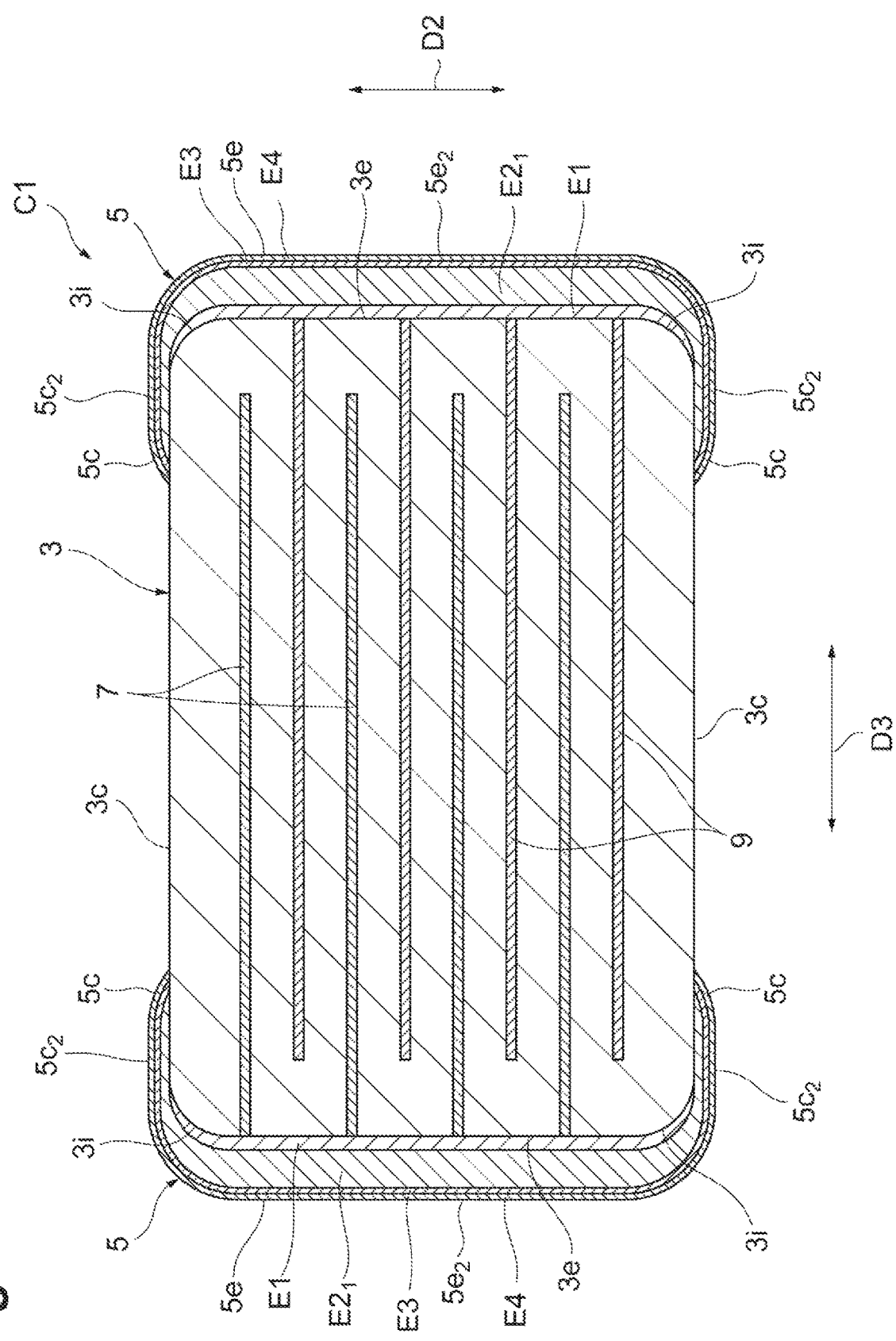
FIG. 4 is a view illustrating the cross-sectional configuration of the multilayer capacitor according to the embodiment.
Figure 5:
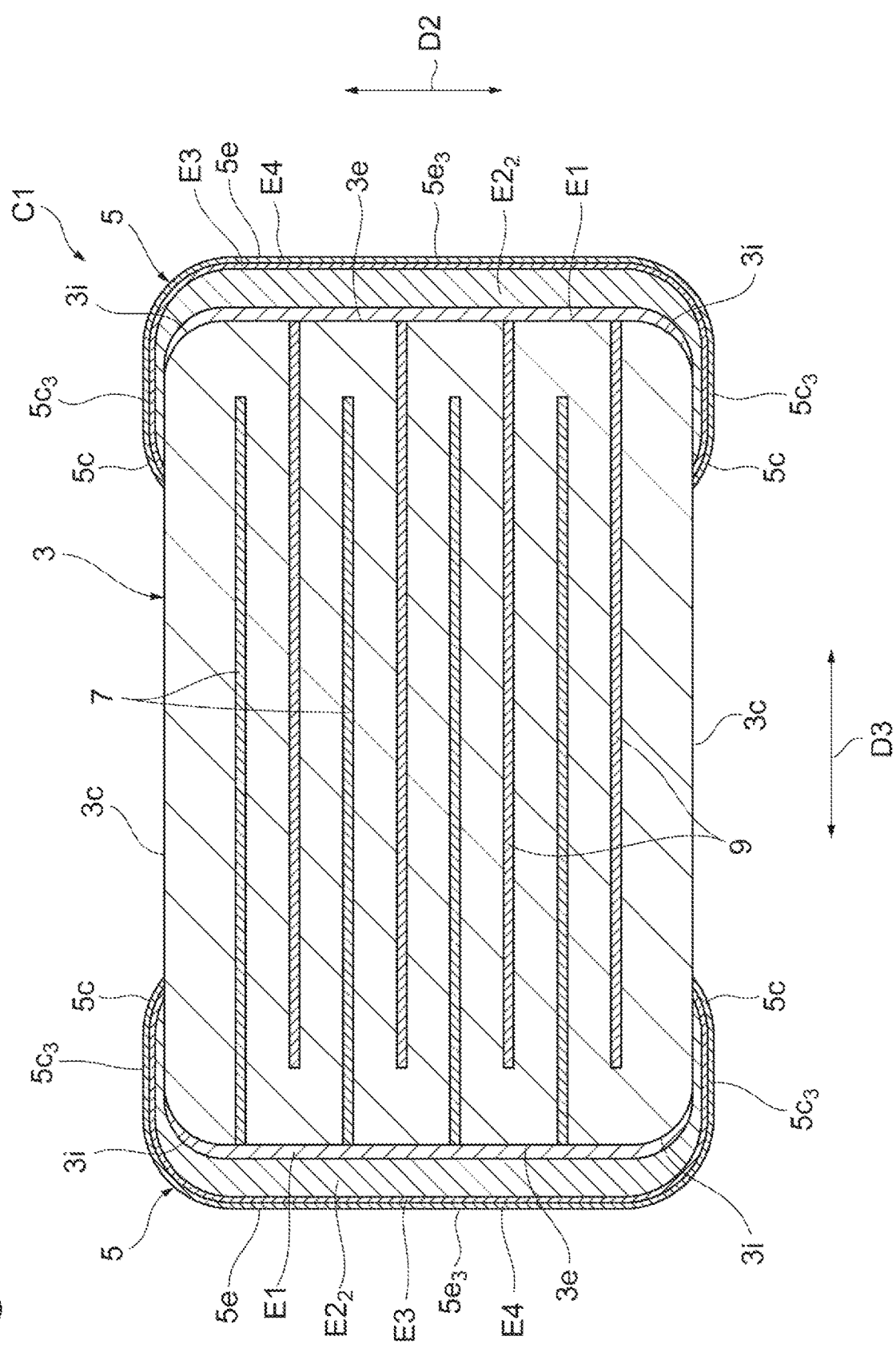
FIG. 5 is a view illustrating the cross-sectional configuration of the multilayer capacitor according to the embodiment.
Figure 6:
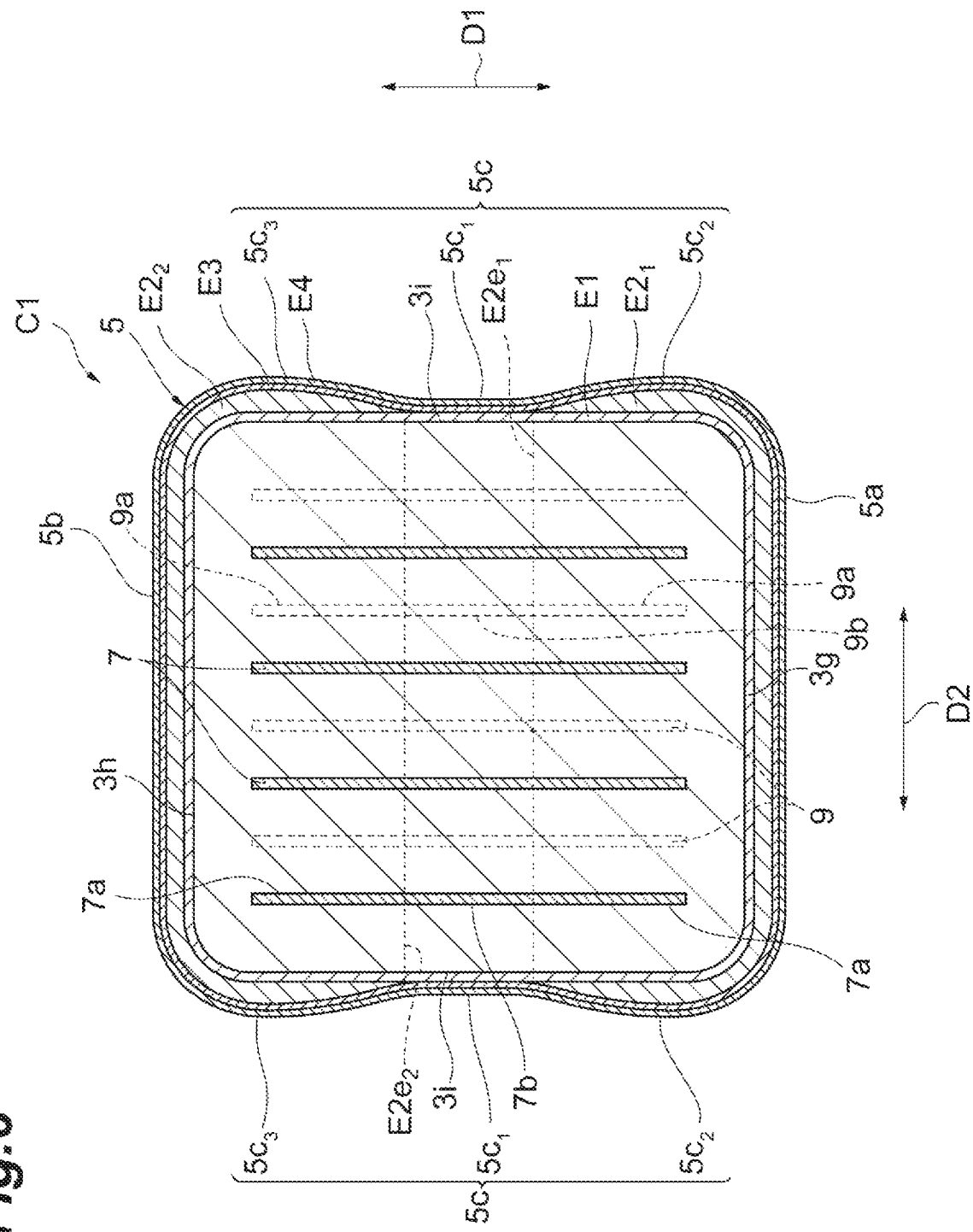
FIG. 6 is a view illustrating the cross-sectional configuration of the multilayer capacitor according to the embodiment.
Figure 7:
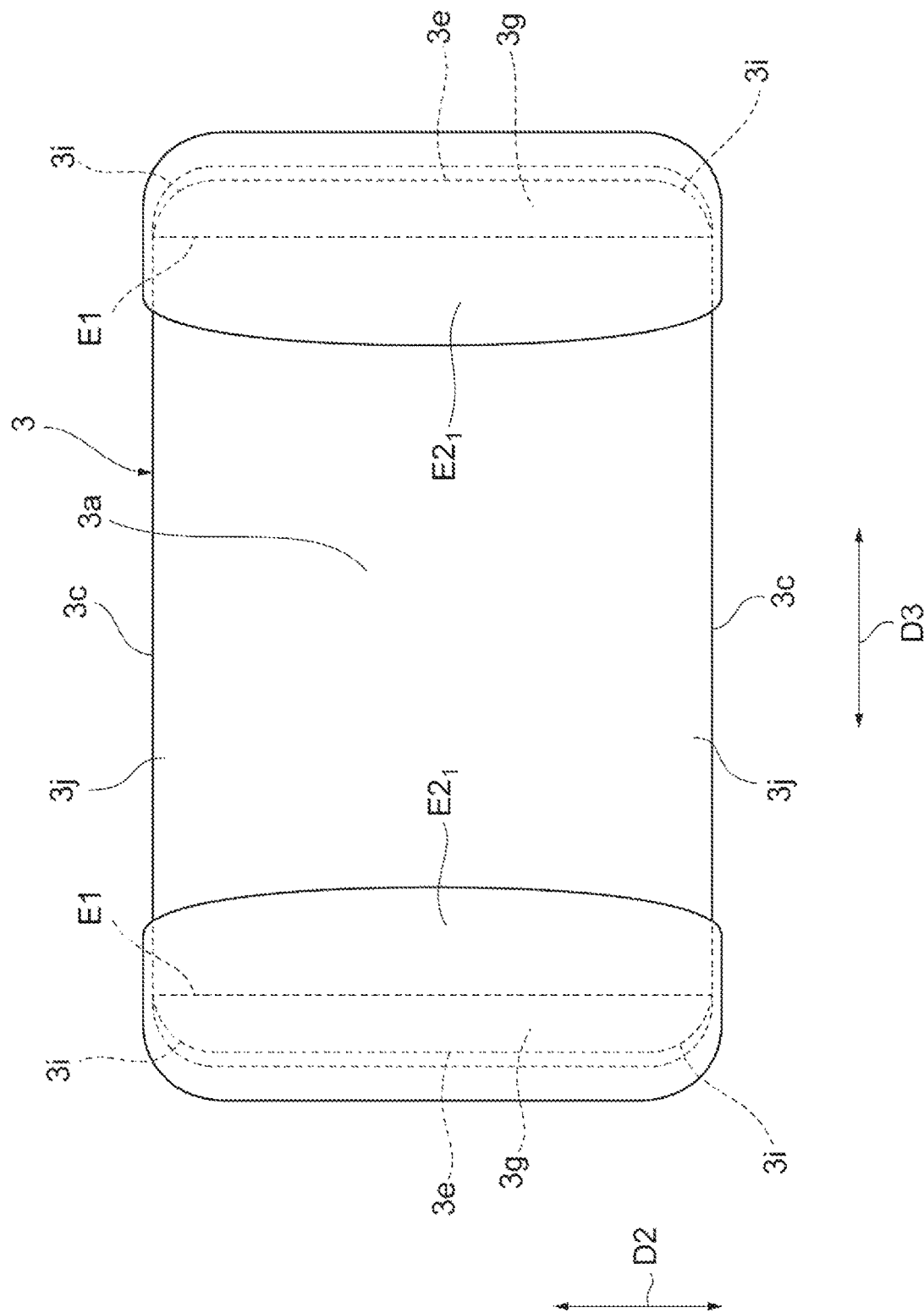
FIG. 7 is a plan view illustrating an element body, a first electrode layer, and a second electrode layer.
Figure 8:
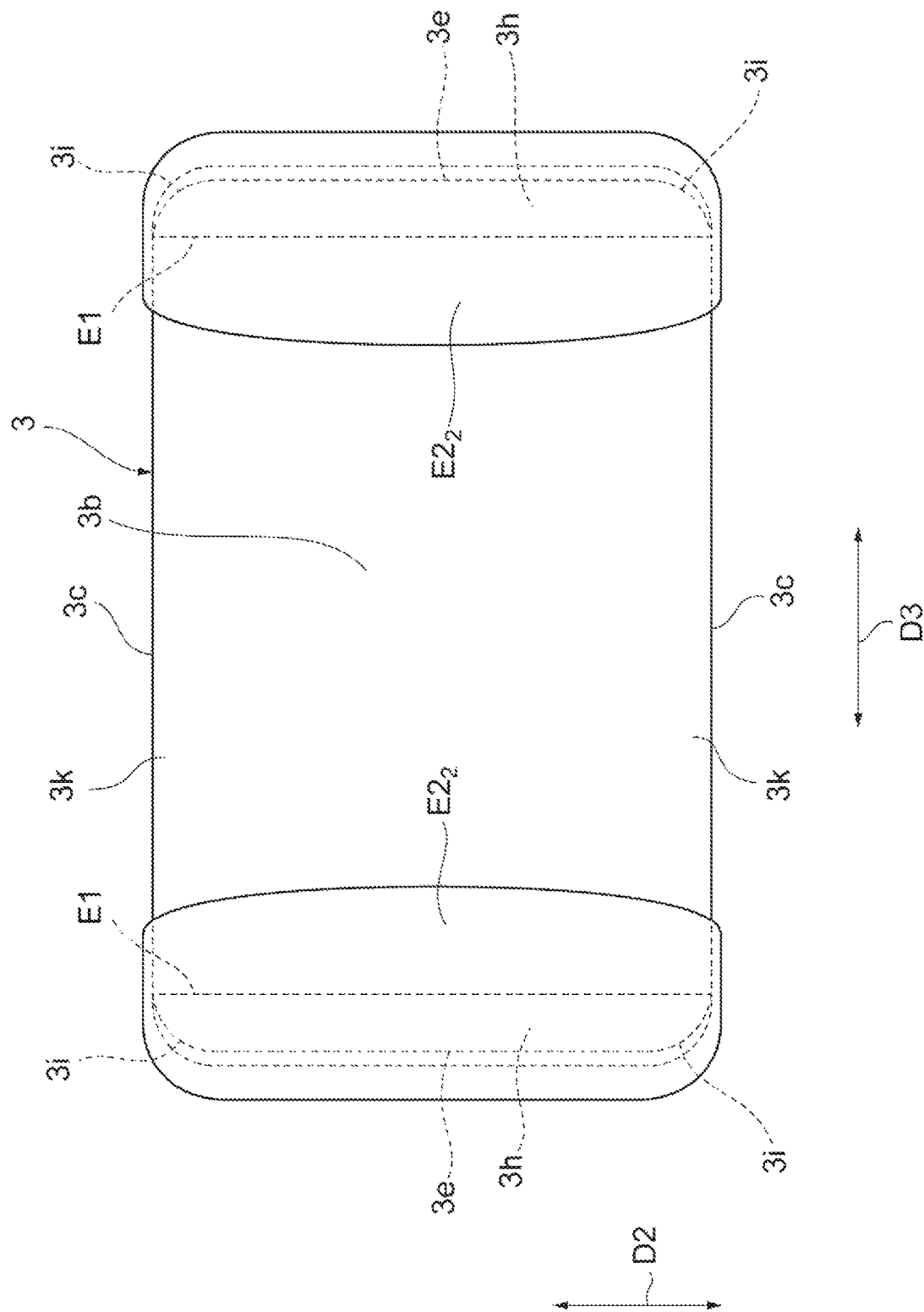
FIG. 8 is a plan view illustrating the element body, the first electrode layer, and the second electrode layer.
Figure 9:
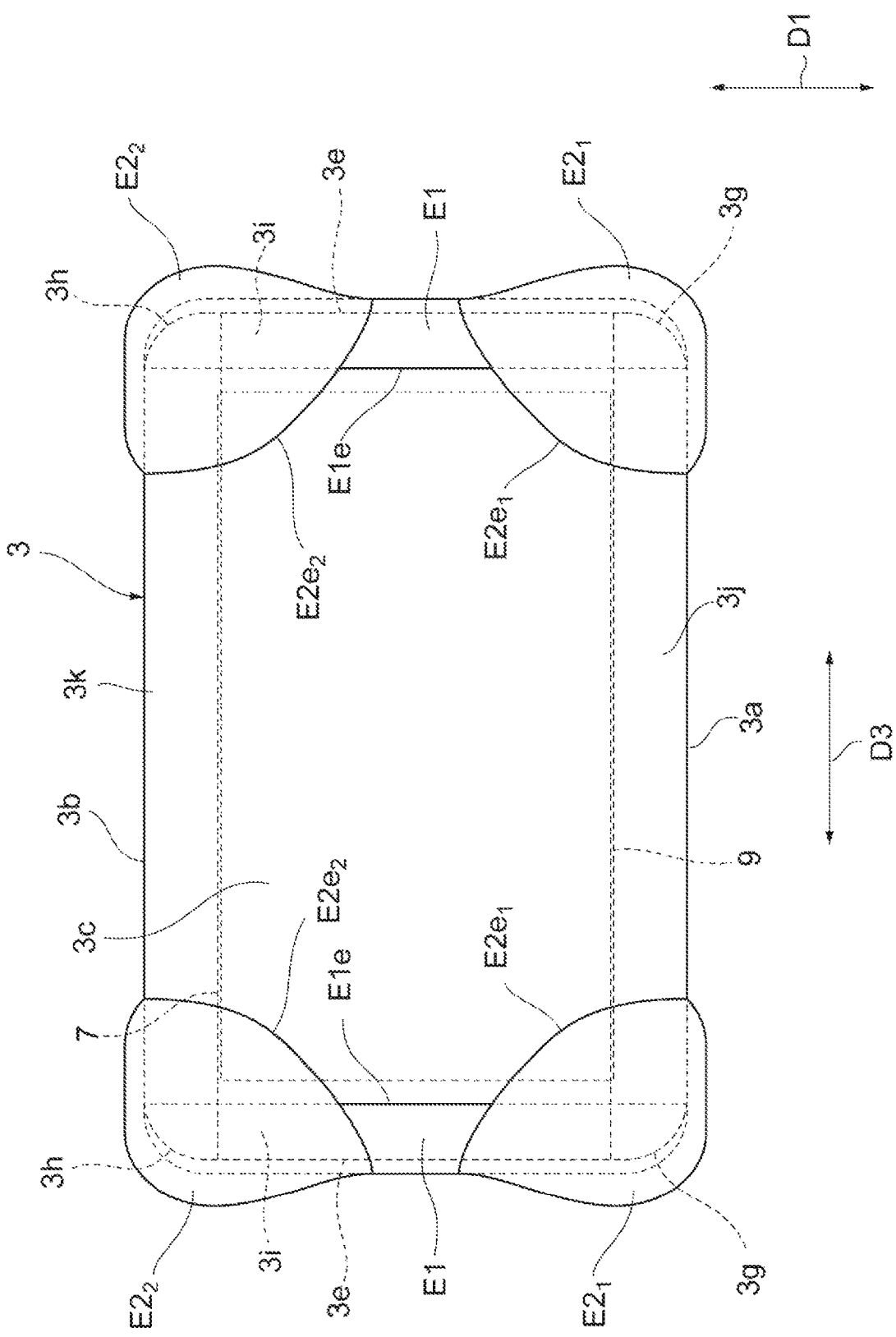
FIG. 9 is a side view illustrating the element body, the first electrode layer, and the second electrode layer.
Figure 10:
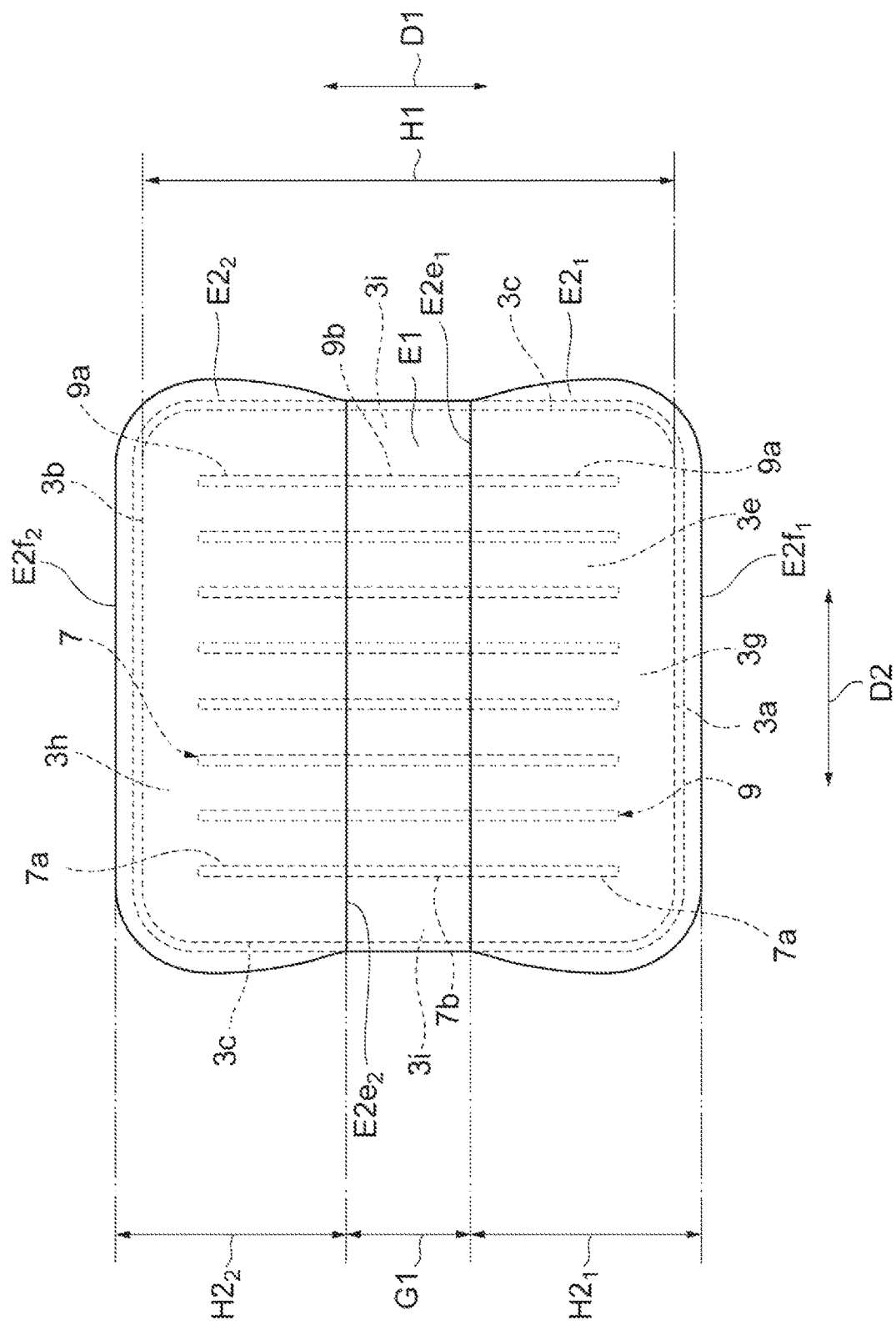
FIG. 10 is an end view illustrating the element body, the first electrode layer, and the second electrode layer.

A configuration of a multilayer capacitor C1 according to an embodiment will be described with reference to FIGS. 1 to 10. FIG. 1 is a perspective view of the multilayer capacitor according to the embodiment. FIG. 2 is a side view of the multilayer capacitor according to the embodiment. FIGS. 3 to 6 are views illustrating a cross-sectional configuration of the multilayer capacitor according to the embodiment. FIGS. 7 and 8 are plan views illustrating an element body, a first electrode layer, and a second electrode layer. FIG. 9 is a side view illustrating the element body, the first electrode layer, and the second electrode layer. FIG. 10 is an end view illustrating the element body, the first electrode layer, and the second electrode layer. In the present embodiment, an electronic component is, for example, the multilayer capacitor C1.

As illustrated in FIG. 1, the multilayer capacitor C1 includes an element body 3 of a rectangular parallelepiped shape and a plurality of external electrodes 5. In the present embodiment, the multilayer capacitor C1 includes a pair of external electrodes 5. The pair of external electrodes 5 is disposed on an outer surface of the element body 3. The pair of external electrodes 5 is separated from each other. The rectangular parallelepiped shape includes a rectangular parallelepiped shape in which corners and ridges are chamfered, and a rectangular parallelepiped shape in which the corners and ridges are rounded.

The element body 3 includes a pair of principal surfaces 3a and 3b opposing each other, a pair of side surfaces 3c opposing each other, and a pair of end surfaces 3e opposing each other. The pair of principal surfaces 3a and 3b and the pair of side surfaces 3c have a rectangular shape. The direction in which the pair of principal surfaces 3a and 3b opposes each other is a first direction D1. The direction in which the pair of side surfaces 3c opposes each other is a second direction D2. The direction in which the pair of end surfaces 3e opposes each other is a third direction D3. The multilayer capacitor C1 is solder-mounted on an electronic device. The electronic device includes, for example, a circuit board or an electronic component. The principal surface 3a of the multilayer capacitor C1 opposes the electronic device. The principal surface 3a is arranged to constitute a mounting surface. The principal surface 3a is the mounting surface. The principal surface 3b may be arranged to constitute a mounting surface.

The first direction D1 is a direction orthogonal to the respective principal surfaces 3a and 3b and is orthogonal to the second direction D2. The third direction D3 is a direction parallel to the respective principal surfaces 3a and 3b and the respective side surfaces 3c, and is orthogonal to the first direction D1 and the second direction D2. The second direction D2 is a direction orthogonal to the respective side surfaces 3c. The third direction D3 is a direction orthogonal to the respective end surfaces 3e. In the present embodiment, a length of the element body 3 in the third direction D3 is larger than a length of the element body 3 in the first direction D1, and larger than a length of the element body 3 in the second direction D2. The third direction D3 is a longitudinal direction of the element body 3.

The pair of side surfaces 3c extends in the first direction D1 to couple the pair of principal surfaces 3a and 3b. The pair of side surfaces 3c also extends in the third direction D3. The pair of end surfaces 3e extends in the first direction D1 to couple the pair of principal surfaces 3a and 3b. The pair of end surfaces 3e also extends in the second direction D2.

The element body 3 includes a pair of ridge portions 3g, a pair of ridge portions 3h, four ridge portions 3i, a pair of ridge portions 3j, and a pair of ridge portions 3k. The ridge portion 3g is located between the end surface 3e and the principal surface 3a. The ridge portion 3h is located between the end surface 3e and the principal surface 3b. The ridge portion 3i is located between the end surface 3e and the side surface 3c. The ridge portion 3j is located between the principal surface 3a and the side surface 3c, The ridge portion 3k is located between the principal surface 3b and the side surface 3c. In the present embodiment, each of the ridge portions 3g, 3h, 3i, 3j, and 3k is rounded to curve. The element body 3 is subject to what is called a round chamfering process.

The end surface 3e and the principal surface 3a are indirectly adjacent to each other with the ridge portion 3g between the end surface 3e and the principal surface 3a. The end surface 3e and the principal surface 3b are indirectly adjacent to each other with the ridge portion 3h between the end surface 3e and the principal surface 3b. The end surface 3e and the side surface 3c are indirectly adjacent to each other with the ridge portion 3i between the end surface 3e and the side surface 3c. The principal surface 3a and the side surface 3c are indirectly adjacent to each other with the ridge portion 3j between the principal surface 3a and the side surface 3c, The principal surface 3b and the side surface 3c are indirectly adjacent to each other with the ridge portion 3k between the principal surface 3b and the side surface 3c.

The element body 3 is configured by laminating a plurality of dielectric layers in the second direction D2. The element body 3 includes the plurality of laminated dielectric layers. In the element body 3, a lamination direction of the plurality of dielectric layers coincides with the second direction D2. Each dielectric layer includes, for example, a sintered body of a ceramic green sheet containing a dielectric material. The dielectric material includes, for example, a dielectric ceramic of $BaTiO_3$ base, $Ba(Ti,Zr)O_3$ base, or $(Ba,Ca)TiO_3$ base. In an actual element body 3, each of the dielectric layers is integrated to such an extent that a boundary between the dielectric layers cannot be visually recognized. In the element body 3, the lamination direction of the plurality of dielectric layers may coincide with the first direction D1.

As illustrated in FIGS. 3 to 6, the multilayer capacitor C1 includes a plurality of internal electrodes 7 and a plurality of internal electrodes 9. Each of the internal electrodes 7 and 9 is an internal conductor disposed in the element body 3. Each of the internal electrodes 7 and 9 is made of a conductive material that is commonly used as an internal conductor of a multilayer electronic component. The conductive material includes, for example, a base metal. The conductive material includes, for example, Ni or Cu. Each of the internal electrodes 7 and 9 is configured as a sintered body of conductive paste containing the conductive material described above. In the present embodiment, the internal electrodes 7 and 9 are made of Ni.

The internal electrodes 7 and the internal electrodes 9 are disposed in different positions (layers) in the second direction D2. The internal electrodes 7 and the internal electrodes 9 are alternately disposed in the element body 3 to oppose each other in the second direction D2 with an interval therebetween. Polarities of the internal electrodes 7 and the internal electrodes 9 are different from each other. In a case in which the lamination direction of the plurality of dielectric layers is the first direction D1, the internal electrodes 7 and the internal electrodes 9 are disposed in different positions (layers) in the first direction D1. One end of each of the internal electrodes 7 and 9 is exposed to a corresponding end surface 3e of the pair of the end surfaces 3e. Each of the internal electrodes 7 and 9 includes one end exposed to the corresponding end surface 3e.

The plurality of internal electrodes 7 and the plurality of internal electrodes 9 are alternately disposed in the second direction D2. The internal electrodes 7 and 9 are located in a plane approximately orthogonal to the principal surfaces 3a and 3b. The internal electrodes 7 and the internal electrodes 9 oppose each other in the second direction D2. The direction (second direction D2) in which the internal electrodes 7 and the internal electrodes 9 oppose each other is orthogonal to the direction (first direction D1) orthogonal to the principal surfaces 3a and 3b.

As illustrated in FIG. 2, the external electrodes 5 are disposed at both end portions of the element body 3 in the third direction D3. Each of the external electrodes 5 is disposed on the corresponding end surface 3e side of the element body 3. As illustrated in FIGS. 3 to 6, the external electrode 5 includes a plurality of electrode portions 5a, 5b, 5c, and 5e. The electrode portion 5a is disposed on the principal surface 3a and the ridge portion 3g. The electrode portion 5b is disposed on the principal surface 3b and the ridge portion 3h. The electrode portion 5c is disposed on each side surface 3c and each ridge portion 3i. The electrode portion 5e is disposed on the corresponding end surface 3e. The external electrode 5 also includes electrode portions disposed on the ridge portion 3j.

The external electrode 5 is formed on the five surfaces, that is, the pair of the principal surface 3a and 3b, the end surface 3e, and the pair of side surfaces 3c, as well as on the ridge portions 3g, 3h, 3i, and 3j. The electrode portions 5a, 5b, 5c, and 5e adjacent each other are coupled and are electrically connected to each other. Each electrode portion 5e covers all one ends of the corresponding internal electrodes 7 or 9. The electrode portion 5e is directly connected to the corresponding internal electrodes 7 or 9. The external electrode 5 is electrically connected to the corresponding internal electrodes 7 or 9.

As illustrated in FIGS. 3 to 6, the external electrode 5 includes a First electrode layer E1, second electrode layers $E2_1$ and $E2_2$, a third electrode layer E3, and a fourth electrode layer E4. The fourth electrode layer E4 is arranged to constitute the outermost layer of the external electrode 5. The electrode portion 5a includes the first electrode layer E1, the second electrode layer $E2_1$, the third electrode layer E3, and the fourth electrode layer E4. The electrode portion 5b includes the first electrode layer E1, the second electrode layer $E2_2$, the third electrode layer E3, and the fourth electrode layer E4. Each of the electrode portions 5c, and 5e includes the first electrode layer E1, the second electrode layers $E2_1$ and $E2_2$, the third electrode layer E3, and the fourth electrode layer E4.

The first electrode layer E1 included in the electrode portion 5a is disposed on the ridge portion 3g, and is not disposed on the principal surface 3a. The first electrode layer E1 included in the electrode portion 5a is in contact with the entire ridge portion 3g. The principal surface 3a is not covered with the first electrode layer E1, and is exposed from the first electrode layer E1. The second electrode layer $E2_1$ included in the electrode portion 5a is disposed on the first electrode layer E1 and the principal surface 3a. The first electrode layer E1 included in the electrode portion 5a is entirely covered with the second electrode layer $E2_1$. The second electrode layer $E2_1$ included in the electrode portion 5a is in contact with one part of the principal surface 3a and the entire first electrode layer E1. The one part of the principal surface 3a is, for example, the partial region near the end surface 3e, in the principal surface 3a. That is, the one part of the principal surface 3a is close to the end surface 3e. The electrode portion 5a is four-layered on the ridge portion 3g, and is three-layered on the principal surface 3a.

As described above, in a case in which an element is described as covering another element, the element may directly cover the other element or indirectly cover the other element. In a case in which an element is described as indirectly covering another element, an intervening element is present between the element and the other element. In a case in which an element is described as directly covering another element, no intervening element is present between the element and the other element.

The second electrode layer $E2_1$ included in the electrode portion 5a is formed to cover the entire ridge portion 3g and the one part of the principal surface 3a. The one part of the principal surface 3a is, for example, the partial region near the end surface 3e, in the principal surface 3a. That is, the one part of the principal surface 3a is close to the end surface 3e. The second electrode layer $E2_1$ included in the electrode portion 5a indirectly covers the entire ridge portion 3g in such a manner that the first electrode layer E1 is located between the second electrode layer $E2_1$ and the ridge portion 3g. The second electrode layer $E2_1$ included in the electrode portion 5a directly covers the one part of the principal surface 3a. The second electrode layer $E2_1$ included in the electrode portion 5a directly covers an entire portion of the first electrode layer E1 formed on the ridge portion 3g.

The first electrode layer E1 included in the electrode portion 5b is disposed on the ridge portion 3h, and is not disposed on the principal surface 3b. The first electrode layer E1 included in the electrode portion 5b is in contact with the entire ridge portion 3h. The principal surface 3b is not covered with the first electrode layer E1, and is exposed from the first electrode layer E1. The second electrode layer $E2_2$ included in the electrode portion 5b is disposed on the first electrode layer E1 and the principal surface 3b. The first electrode layer E1 included in the electrode portion 5b is entirely covered with the second electrode layer $E2_2$. The second electrode layer $E2_2$ included in the electrode portion 5b is in contact with one part of the principal surface 3b and the entire first electrode layer E1. The one part of the principal surface 3b is, for example, a partial region near the end surface 3e, in the principal surface 3b. That is, the one part of the principal surface 3b is close to the end surface 3e. The electrode portion 5b is four-layered on the ridge portion 3h, and is three-layered on the principal surface 3b.

The second electrode layer. $E2_2$ included in the electrode portion 5b is formed to cover the entire ridge portion 3h and the one part of the principal surface 3b. The one part of the principal surface 3b is, for example, the partial region near the end surface 3e, in the principal surface 3b. That is, the one part of the principal surface 3b is close to the end surface 3e. The second electrode layer $E2_2$ included in the electrode portion 5a indirectly covers the entire ridge portion 3h in such a manner that the first electrode layer E1 is located between the second electrode layer $E2_2$ and the ridge portion 3h. The second electrode layer $E2_2$ included in the electrode portion 5b directly covers the one part of the principal surface 3b. The second electrode layer $E2_2$ included in the electrode portion 5b directly covers an entire portion of the first electrode layer E1 formed on the ridge portion 3h.

The first electrode layer E1 included in the electrode portion 5c is disposed on the ridge portion 3i, and is not disposed on the side surface 3c. The first electrode layer E1 included in the electrode portion 5c is in contact with the entire ridge portion 3i. The side surface 3c is not covered with the first electrode layer E1, and is exposed from the first electrode layer E1. Each of the second electrode layers $E2_1$ and $E2_2$ included in the electrode portion 5c is disposed on the first electrode layer E1 and the side surface 3c. One part of the first electrode layer E1 is covered with the second electrode layers $E2_1$ and $E2_2$. Each of the second electrode layers $E2_1$ and $E2_2$ included in the electrode portion 5c is in contact with one part of the side surface 3c and the one part of the first electrode layer E1. Each of the second electrode layers $E2_1$ and $E2_2$ included in the electrode portion 5c includes a portion located on the side surface 3c.

The second electrode layer $E2_1$ included in the electrode portion 5c is formed to cover one part of the ridge portion 3i and one part of the side surface 3c. The one part of the ridge portion 3i is, for example, a partial region near the principal surface 3a, in the ridge portion 3i. That is, the one part of the ridge portion 3i is close to the principal surface 3a. The one part of the side surface 3c is, for example, a corner region near the principal surface 3a and end surface 3e, in the side surface 3c. That is, the one part of the side surface 3c is close to the principal surface 3a and end surface 3e. The second electrode layer $E2_1$ included in the electrode portion 5c indirectly covers the one part of the ridge portion 3i in such a manner that the first electrode layer E1 is located between the second electrode layer $E2_1$ and the ridge portion 3i. The second electrode layer $E2_1$ included in the electrode portion 5c directly covers the one part of the side surface 3c. The second electrode layer $E2_1$ included in the electrode portion 5c directly covers one part of the portion of the first electrode layer E1 formed on the ridge portion 3i.

The second electrode layer $E2_2$ included in the electrode portion 5c is formed to cover one part of the ridge portion 3i and one part of the side surface 3c. The one part of the ridge portion 3i is, for example, a partial region near the principal surface 3b, in the ridge portion 3i, That is, the one part of the ridge portion 3i is close to the principal surface 3b. The one part of the side surface 3c is, for example, a corner region near the principal surface 3b and end surface 3e, in the side surface 3c. That is, the one part of the side surface 3c is close to the principal surface 3b and end surface 3e. The second electrode layer $E2_2$ included in the electrode portion 5c indirectly covers the one part of the ridge portion 3i in such a manner that the first electrode layer E1 is located between the second electrode layer $E2_2$ and the ridge portion 3i. The second electrode layer $E2_2$ included in the electrode portion 5c directly covers the one part of the side surface 3c. The second electrode layer $E2_2$ included in the electrode portion 5c directly covers one part of the portion of the first electrode layer E1 formed on the ridge portion 3i.

The electrode portion 5c includes a plurality of regions $5c_1$, $5c_2$, and $5c_3$. In the present embodiment, the electrode portion 5c includes only three regions $5c_1$, $5c_2$, and $5c_3$. The region $5c_2$ is located closer to the principal surface 3a than the region $5c_1$. The region $5c_3$ is located closer to the principal surface 3b than the region $5c_1$. The region $5c_1$ includes the first electrode layer E1, the third electrode layer E3, and the fourth electrode layer E4. The region $5c_1$ does not include the second electrode layers $E2_1$ and $E2_2$. The region $5c_1$ is three-layered. The region $5c_2$ includes the first electrode layer E1, the second electrode layer $E2_1$, the third electrode layer E3, and the fourth electrode layer E4. The region $5c_1$ includes the first electrode layer E1, the second electrode layer $E2_2$, the third electrode layer E3, and the fourth electrode layer E4. Each of the regions $5c_2$ and $5c_3$ is four-layered on the ridge portion 3i, and is three-layered on the side surface 3c. The region $5c_1$ is the region where the first electrode layer E1 is exposed from the second electrode layers $E2_1$ and. $E2_2$. The region $5c_2$ is the region where the first electrode layer E1 is covered with the second electrode layer $E2_1$. The region $5c_3$ is the region where the first electrode layer E1 is covered with the second electrode layer $E2_2$.

The first electrode layer E1 included in the electrode portion 5e is disposed on the end surface 3e. The end surface 3e is entirely covered with the first electrode layer E1. The first electrode layer E1 included in the electrode portion 5e is in contact with the entire end surface 3e. The first electrode layer E1 included in the electrode portion 5e is formed on the end surface 3e to be coupled to the one ends of the corresponding internal electrodes 7 or 9.

The second electrode layer $E2_1$ included in the electrode portion 5e is disposed on the first electrode layer E1. The first electrode layer E1 is partially covered with the second electrode layer $E2_1$. The second electrode layer $E2_1$ included in the electrode portion 5e is in contact with one part of the first electrode layer E1. The second electrode layer $E2_1$ included in the electrode portion 5e is formed to cover one part of the end surface 3e. The one part of the end surface 3e is, for example, a partial region near the principal surface 3a, in the end surface 3e. That is, the one part of the end surface 3e is close to the principal surface 3a. The second electrode layer $E2_1$ included in the electrode portion 5e indirectly covers the one part of the end surface 3e in such a manner that the first electrode layer E1 is located between the second electrode layer $E2_1$ and the end surface 3e. The second electrode layer $E2_1$ included in the electrode portion 5e directly covers one part of the portion of the first electrode layer E1 formed on the end surface 3e.

The second electrode layer $E2_2$ included in the electrode portion 5e is disposed on the first electrode layer E1. The first electrode layer E1 is partially covered with the second electrode layer $E2_2$. The second electrode layer $E2_2$ included in the electrode portion 5e is in contact with one part of the first electrode layer E1. The second electrode layer $E2_2$ included in the electrode portion 5e is formed to cover one part of the end surface 3e. One part of the end surface 3e is, for example, a partial region on the end surface 3e, which is close to the principal surface 3b. The second electrode layer $E2_2$ included in the electrode portion 5e indirectly covers one part of the end surface 3e in such a manner that the first electrode layer E1 is located between the second electrode layer $E2_2$ and the end surface 3e. The second electrode layer $E2_2$ included in the electrode portion 5e directly covers one part of the portion of the first electrode layer E1 formed on the end surface 3e.

The electrode portion 5e includes a plurality of regions $5e_1$, $5e_2$, and $5e_a$. In the present embodiment, the electrode portion 5e includes only three regions $5e_1$, $5e_2$, and $5e_3$. The region $5e_2$ is located closer to the principal surface 3a than the region $5e_1$. The region $5e_3$ is located closer to the principal surface 3b than the region $5e_1$. The region $5e_1$ includes the first electrode layer E1, the third electrode layer E3, and the fourth electrode layer E4. The region $5e_1$ does not include the second electrode layers $E2_1$ and $E2_2$. The region $5e_1$ is three-layered. The region $5e_2$ includes the first electrode layer E1, the second electrode layer $E2_1$, the third electrode layer E3, and the fourth electrode layer E4. The region $5e_3$ includes the first electrode layer E1, the second electrode layer $E2_2$, the third electrode layer E3, and the fourth electrode layer E4. Each of the regions $5e_2$ and $5e_3$ is four-layered. The region $5e_1$ is the region where the first electrode layer E1 is exposed from the second electrode layers $E2_1$ and $E2_2$. The region $5e_2$ is the region where the first electrode layer E1 is covered with the second electrode layer $E2_1$. The region $5e_3$ is the region where the first electrode layer E1 is covered with the second electrode layer $E2_2$.

The first electrode layer E1 is formed by sintering conductive paste applied onto the surface of the element body 3. The first electrode layer E1 is formed to cover the end surface 3e and the ridge portions 3g, 3h, and 3i. The first electrode layer E1 is formed by sintering a metal component (metal powder) contained in the conductive paste. The first electrode layer E1 includes a sintered metal layer. The first electrode layer E1 includes a sintered metal layer formed on the element body 3. The first electrode layer E1 is not intentionally formed on the pair of principal surfaces 3a and 3b and the pair of side surfaces 3c. The first electrode layer E1 may be unintentionally formed on the principal surfaces 3a and 3b and the side surfaces 3c due to a production error, for example. In the present embodiment, the first electrode layer E1 is a sintered metal layer made of Cu. The first electrode layer E1 may be a sintered metal layer made of Ni. The first electrode layer E1 contains a base metal. The conductive paste contains, for example, powder made of Cu or Ni, a glass component, an organic binder, and an organic solvent. The first electrode layer E1 included in the electrode portion 5a, the first electrode layer E1 included in the electrode portion 5b, the first electrode layer E1 included in the electrode portion 5c, and the first electrode layer E1 included in the electrode portion 5e are integrally formed.

The second electrode layers $E2_1$ and $E2_2$ are formed by curing conductive resin applied onto the first electrode layer E1, the pair of the principal surfaces 3a and 3b, and the pair of side surfaces 3c. The second electrode layers $E2_1$ and $E2_2$ are formed over the first electrode layer E1 and the element body 3. The first electrode layer E1 serves as an underlying metal layer for forming the second electrode layers $E2_1$ and $E2_2$. Each of the second electrode layers $E2_1$ and $E2_2$ is a conductive resin layers formed on the first electrode layer E1. The conductive resin contains, for example, a resin, a conductive material, and an organic solvent. The resin is, for example, a thermosetting resin. The conductive material is, for example, metal powder. The metal powder is, for example, Ag powder or Cu powder. The thermosetting resin is, for example, a phenolic resin, an acrylic resin, a silicone resin, an epoxy resin, or a polyimide resin.

In the present embodiment, the second electrode layer $E2_1$ covers one part of the first electrode layer E1. The one part of the first electrode layer E1 is, for example, the regions corresponding to the electrode portion 5a, the region $5c_2$ of the electrode portion 5c, and the region $5e_2$ of the electrode portion 5e, in the first electrode layer E1. The second electrode layer $E2_1$ directly covers one part of the ridge portion 3j. The one part of the ridge portion 3j is, for example, a partial region near the end surface 3e, in the ridge portion 3j. That is, the one part of the ridge portion 3j is close to the end surface 3e. The second electrode layer $E2_1$ is in contact with the one part of the ridge portion 3j. The second electrode layer $E2_2$ covers one part of the first electrode layer E1. The one part of the first electrode layer E1 is, for example, the regions corresponding to the electrode portion 5b, the region $5c_3$ of the electrode portion 5c, and the region $5e_3$ of the electrode portion 5e, in the first electrode layer E1. The second electrode layer $E2_2$ directly covers one part of the ridge portion 3k. The one part of the ridge portion 3k is, for example, a partial region near the end surface 3e, in the ridge portion 3k. That is, the one part of the ridge portion 3k is close to the end surface 3e. The second electrode layer $E2_2$ is in contact with the one part of the ridge portion 3k. The second electrode layer $E2_1$ included in the electrode portion 5a, the second electrode layer $E2_1$ included in the electrode portion 5c, and the second electrode layer $E2_1$ included in the electrode portion 5e are integrally formed. The second electrode layer $E2_2$ included in the electrode portion 5a, the second electrode layer $E2_2$ included in the electrode portion 5c, and the second electrode layer $E2_2$ included in the electrode portion 5e are integrally formed.

The third electrode layer E3 is formed on the second electrode layers $E2_1$ and $E2_2$ and the first electrode layer E1 by plating method. The third electrode layer E3 is formed on a portion of the first electrode layer E1 exposed from the second electrode layers $E2_1$ and $E2_2$. In the present embodiment, the third electrode layer E3 is formed on the first electrode layer E1 and the second electrode layers $E2_1$ and $E2_2$ by Ni plating. The third electrode layer E3 is a Ni plating layer. The third electrode layer E3 may be an Sn plating layer, a Cu plating layer, or an Au plating layer. The third electrode layer E3 contains Ni, Sn, Cu, or Au. The fourth electrode layer E4 is formed on the third electrode layer E3 by plating method. In the present embodiment, the fourth electrode layer E4 is formed on the third electrode layer E3 by Sn plating. The fourth electrode layer E4 is an Sn plating layer. The fourth electrode layer E4 may be a Cu plating layer or an Au plating layer. The fourth electrode layer E4 contains Sn, Cu, or Au.

The third electrode layer E3 and the fourth electrode layer E4 constitute a plating layer formed on the second electrode layers $E2_1$ and $E2_2$. In the present embodiment, the plating layer formed on the second electrode layers $E2_1$ and $E2_2$ is two-layered. The third electrode layer E3 included in the electrode portion 5a, the third electrode layer E3 included in the electrode portion 5b, the third electrode layer E3 included in the electrode portion 5c, and the third electrode layer E3 included in the electrode portion 5e are integrally formed. The fourth electrode layer E4 included in the electrode portion 5a, the fourth electrode layer E4 included in the electrode portion 5b, the fourth electrode layer E4 included in the electrode portion 5c, and the fourth electrode layer E4 included in the electrode portion 5e are integrally formed.

The first electrode layer E1 (first electrode layer E1 included in the electrode portion 5e) is formed on the end surface 3e to be connected to the corresponding internal electrodes 7 and 9. The first electrode layer E1 covers the entire end surface 3e, the entire ridge portion 3g, the entire ridge portion 3h, and the entire ridge portion 3i. The first electrode layer E1 (first electrode layer E1 included in the electrode portion 5e) is directly connected to the corresponding internal electrodes 7 and 9.

The second electrode layer $E2_1$ (second electrode layer $E2_1$ included in the electrode portions 5a, 5c, and 5e) continuously covers one part of the principal surface 3a, one part of the end surface 3e, and one part of each of the pair of side surfaces 3c. The second electrode layer $E2_1$ (second electrode layer $E2_1$ included in the electrode portions 5a, 5c, and 5e) covers the entire ridge portion 3g, one part of the ridge portion 3i, and one part of the ridge portion 3j. The second electrode layer $E2_1$ includes a plurality of portions each corresponding to the one part of the principal surface 3a, the one part of the end surface 3e, the one part of each of the pair of side surfaces 3c, the entire ridge portion 3g, the one part of the ridge portion 3i, and the one part of the ridge portion 3j.

The second electrode layer $E2_2$ (second electrode layer $E2_2$ included in the electrode portions 5b, 5c, and 5e) continuously covers one part of the principal surface 3b, one part of the end surface 3e, and one part of each of the pair of side surfaces 3c. The second electrode layer $E2_2$ (second electrode layer $E2_2$ included in the electrode portions 5a, 5c, and 5e) covers the entire ridge portion 3b, one part of the ridge portion 3i, and one part of the ridge portion 3b, The second electrode layer $E2_2$ includes a plurality of portions each corresponding to the one part of the principal surface 3b, the one part of the end surface 3e, the one part of each of the pair of side surfaces 3c, the entire ridge portion 3b, the one part of the ridge portion 3i, and the one part of the ridge portion 3b.

The first electrode layer E1 (first electrode layer E1 included in the electrode portions 5a, 5b, 5c, and 5e) includes a region covered with the second electrode layer $E2_1$ (second electrode layer $E2_1$ included in the electrode portions 5a, 5c, and 5e) and the second electrode layer $E2_2$ (second electrode layer $E2_2$ included in the electrode portions 5b, 5c, and 5e), and a region not covered with the second electrode layer (second electrode layer $E2_1$ included in the electrode portions 5a, 5c, and 5e) and the second electrode layer $E2_2$ (second electrode layer $E2_2$ included in the electrode portions 5b, 5c, and 5e). The region not covered with the second electrode layers $E2_1$ and $E2_2$ is a region exposed from the second electrode layers $E2_1$ and $E2_2$. The third electrode layer E3 and the fourth electrode layer E4 cover the region on the first electrode layer E1 not covered with the second electrode layers $E2_1$ and $E2_2$ and the second electrode layers $E2_1$ and $E2_2$.

As illustrated in FIG. 7, when viewed from the first direction D1, the first electrode layer E1 (first electrode layer E1 included in the electrode portion 5a) is entirely covered with the second electrode layer $E2_1$. When viewed from the first direction D1, the first electrode layer E1 (first electrode layer E1 included in the electrode portion 5a) is not exposed from the second electrode layer $E2_1$. As illustrated in FIG. 8, when viewed from the first direction D1, the first electrode layer E1 (first electrode layer E1 included in the electrode portion 5b) is entirely covered with the second electrode layer $E2_2$. When viewed from the first direction D1, the first electrode layer E1 (first electrode layer E1 included in the electrode portion 5b) is not exposed from the second electrode layer $E2_2$.

As illustrated in FIG. 9, when viewed from the second direction D2, an end region near the principal surface 3a of the first electrode layer E1 is covered with the second electrode layer $E2_1$. The end region near the principal surface 3a of the first electrode layer E1 includes the first electrode layer E1 included in the region $5c_2$. The end region of the first electrode layer E1 is close to the principal surface 3a. When viewed from the second direction D2, an end edge $E2e_1$ of the second electrode layer $E2_1$ crosses an end edge E1e of the first electrode layer E1. When viewed from the second direction D2, an area of the second electrode layer $E2_1$ located on the side surface 3c and the ridge portion 3i is larger than an area of the first electrode layer E1 located on the ridge portion 3i. When viewed from the second direction D2, an end region near the principal surface 3b of the first electrode layer E1 is covered with the second electrode layer $E2_2$. The end region near the principal surface 3b of the first electrode layer E1 includes the first electrode layer E1 included in the region $5c_3$. The other end region of the first electrode layer E1 is close to the principal surface 3b. When viewed from the second direction D2, an end edge $E2e_2$ of the second electrode layer $E2_2$ crosses the end edge E1e of the first electrode layer E1. When viewed from the second direction D2, an area of the second electrode layer $E2_2$ located on the side surface 3c and the ridge portion 3i is larger than the area of the first electrode layer E1 located on the ridge portion 3i.

When viewed from the second direction D2, a central region of the first electrode layer E1 in the first direction D1 is exposed from the second electrode layers $E2_1$ and $E2_2$. The central region of the first electrode layer E1 in the first direction D1 includes the first electrode layer E1 included in the region $5c_1$. When viewed from the second direction D2, the second electrode layer $E2_1$ and the second electrode layer $E2_2$ are separated from each other in the first direction D1. The second electrode layers $E2_1$ and $E2_2$ located on the side surface 3c oppose the internal electrodes 7 and 9 having polarities different from those of the second electrode layers $E2_1$ and $E2_2$ in the second direction D2.

As illustrated in FIG. 10, when viewed from the third direction D3, the end region near the principal surface 3a of the first electrode layer E1 is covered with the second electrode layer $E2_1$. The end region near the principal surface 3a of the first electrode layer E1 includes the first electrode layer E1 included in the region $5e_2$. When viewed from the third direction D3, the end edge $E2e_1$ of the second electrode layer $E2_1$ is located on the first electrode layer E1. When viewed from the third direction D3, the end region near the principal surface 3b of the first electrode layer E1 is covered with the second electrode layer $E2_2$. The end region near the principal surface 3b of the first electrode layer E1 includes the first electrode layer E1 included in the region $5e_3$. When viewed from the third direction D3, the end edge $E2e_2$ of the second electrode layer $E2_2$ is located on the first electrode layer E1.

When viewed from the third direction D3, a central region of the first electrode layer E1 in the first direction D1 is exposed from the second electrode layers $E2_1$ and $E2_2$. The central region of the first electrode layer E1 in the first direction D1 includes the first electrode layer E1 included in the region $5e_1$. When viewed from the third direction D3, the second electrode layer $E2_1$ and the second electrode layer $E2_2$ are separated from each other in the first direction D1. The first electrode layer E1 included in the electrode portion 5e includes a region covered with the second electrode layer $E2_1$, a region covered with the second electrode layer $E2_2$, and a region exposed from the second electrode layers $E2_1$ and $E2_2$. The third electrode layer E3 and the fourth electrode layer E4 cover the region on the first electrode layer E1 exposed from the second electrode layers $E2_1$ and $E2_2$ and the second electrode layers $E2_1$ and $E2_2$.

When viewed from the third direction D3, a height $H2_1$ of the second electrode layer $E2_1$ in the first direction D1 and a height $H2_2$ of the second electrode layer $E2_2$ in the first direction D1 are larger than an interval G1 between the second electrode layer $E2_1$ and the second electrode layer $E2_2$ in the first direction D1. The height $H2_1$ of the second electrode layer $E2_1$ is, for example, an interval between an end edge $E2f_1$ of the second electrode layer $E2_1$ and the end edge $E2e_1$ of the second electrode layer $E2_1$ in the first direction D1 when viewed from the third direction D3. The end edge $E2f_1$ is constituted by a surface of the second electrode layer $E2_1$ located on the principal surface 3a, when viewed from the third direction D3. The height $H2_2$ of the second electrode layer $E2_2$ is, for example, an interval between an end edge $E2f_2$ of the second electrode layer $E2_2$ and the end edge $E2e_2$ of the second electrode layer $E2_2$ in the first direction D1, when viewed from the third direction D3. The end edge $E2f_2$ is constituted by a surface of the second electrode layer $E2_2$ located on the principal surface 3b, when viewed from the third direction D3. The interval G1 is a width of the region of the first electrode layer E1 exposed from the second electrode layers $E2_1$ and $E2_2$ in the first direction D1. The interval G1 is an interval between the end edge $E2e_1$ of the second electrode layer $E2_1$ and the end edge $E2e_2$ of the second electrode layer $E2_2$ in the first direction D1. The height $H2_1$ of the second electrode layer $E2_1$ and the height $H2_2$ of the second electrode layer $E2_2$ are less than half of a height H1 of the element body 3.

As illustrated in FIG. 10, one end of each of the internal electrodes 7 and 9 includes regions 7a and 9a overlapping with the second electrode layers $E2_1$ and $E2_2$, and regions 7b and 9b not overlapping with the second electrode layers $E2_1$ and $E2_2$, when viewed from the third direction D3. The first electrode layer E1 included in each of the regions $5e_2$ and $5e_1$ is connected to the corresponding regions 7a and 9a. The first electrode layer E1 included in the region $5e_1$ is connected to the corresponding regions 7b and 9b. When viewed from the third direction D3, the end edges $E2e_1$ and $E2e_2$ of the second electrode layers $E2_1$ and $E2_2$ cross the one end of each of the internal electrodes 7 and 9.

In the present embodiment, the second electrode layer $E2_1$ continuously covers only the one part of the principal surface 3a, only the one part of the end surface 3e, and only the one part of each of the pair of side surfaces 3c. The second electrode layer $E2_1$ covers the entire ridge portion $3g$, only the one part of the ridge portion $3i$, and only the one part of the ridge portion $3j$. The second electrode layer $E2_2$ continuously covers only the one part of the principal surface $3b$, only the one part of the end surface $3e$, and only the one part of each of the pair of side surfaces $3c$. The second electrode layer $E2_2$ covers the entire ridge portion $3h$, only the one part of the ridge portion $3i$, and only the one part of the ridge portion $3k$. The portion of the first electrode layer E1 covering the ridge portion $3i$ is partially exposed from the second electrode layers $E2_1$ and $E2_2$. For example, the first electrode layer E1 included in the region $5c_1$ is exposed from the second electrode layers $E2_1$ and $E2_2$. The first electrode layer E1 is formed on the end surface $3e$ to be connected to the corresponding regions $7a$ and $9a$. In the present embodiment, the first electrode layer E1 is formed on the end surface $3e$ to be also connected to the corresponding regions $7b$ and $9b$.

As illustrated in FIG. 2, a width of the region $5c_2$ in the third direction D3 decreases with an increase in distance from the principal surface $3a$. The width of the region $5c_2$ in the third direction D3 decreases with an increase in distance from the electrode portion $5a$. As illustrated in FIG. 2, a width of the region $5c_3$ in the third direction D3 decreases with an increase in distance from the principal surface $3b$. The width of the region $5c_3$ in the third direction D3 decreases with an increase in distance from the electrode portion $5b$. A width of each of the regions $5c_2$ and $5c_3$ in the first direction D1 decreases with an increase in distance from the end surface $3e$. The width of each of the regions $5c_2$ and $5c_3$ in the first direction D1 decreases as it goes away from the electrode portion $5e$. In the present embodiment, when viewed from the second direction D2, the end edge of each of the regions $5c_2$ and $5c_3$ has an approximately arc shape. When viewed from the second direction D2, each of the regions $5c_2$ and $5c_3$ has an approximately fan shape. As illustrated in FIG. 9, in the present embodiment, a width of the second electrode layer $E2_1$ when viewed from the second direction D2 decreases with an increase in distance y from the principal surface $3a$. A width of the second electrode layer $E2_2$ when viewed from the second direction D2 decreases with an increase in distance from the principal surface $3b$.

When viewed from the second direction D2, each of lengths of the portions of the second electrode layers $E2_1$ and $E2_2$ located on the side surface $3c$ in the first direction D1 decreases with an increase in distance from the end portion of the element body 3 in the third direction D3. As illustrated in FIG. 9, when viewed from the second direction D2, the end edges $E2e_1$ of the second electrode layer $E2_1$ has an approximately arc shape. When viewed from the second direction D2, the end edges $E2e_2$ of the second electrode layer $E2_2$ has an approximately arc shape.

In a case in which the multilayer capacitor C1 is solder-mounted on an electronic device, external force applied onto the multilayer capacitor C1 from the electronic device may act as stress on the element body 3. The external force acts on the element body 3 from a solder fillet formed at a solder-mounting, through the external electrode 5. In this case, a crack may occur in the element body 3.

In a case in which the principal surface $3a$ is arranged to constitute the mounting surface, the external force tends to act on a region defined by one part of the principal surface $3a$, one part of the end surface $3e$, and one part of each of the pair of side surfaces $3c$, in the element body 3. In the multilayer capacitor C1, the second electrode layer $E2_1$ (second electrode layer $E2_1$ included in the electrode portions $5a$, $5c$, and $5e$) continuously covers the one part of the principal surface $3a$, the one part of the end surface $3e$, and the one part of each of the pair of side surfaces $3c$. Therefore, the external force applied onto the multilayer capacitor C1 from the electronic device tends not to act on the element body 3.

In a case in which the principal surface $3b$ is arranged to constitute the mounting surface, the external force tends to act on a region defined by one part of the principal surface $3b$, one part of the end surface $3e$, and one part of each of the pair of side surfaces $3c$, in the element body 3. In the multilayer capacitor C1, the second electrode layer $E2_2$ (second electrode layer $E2_2$ included in the electrode portions $5b$, $5c$, and $5e$) continuously covers the one part of the principal surface $3b$, the one part of the end surface $3e$, and the one part of each of the pair of side surfaces $3c$. Therefore, the external force applied onto the multilayer capacitor C1 from the electronic device tends not to act on the element body 3.

Consequently, the multilayer capacitor C1 suppresses occurrence of a crack in the element body 3.

A region between the element body 3 and the second electrode layers $E2_1$ and $E2_2$ may include a path through which moisture infiltrates. In a case in which moisture infiltrates from the region between the element body 3 and the second electrode layers $E2_1$ and $E2_2$, durability of the multilayer capacitor C1 decreases. In the multilayer capacitor C1, each of the second electrode layers $E2_1$ and $E2_2$ covers one part of the end surface $3e$. Therefore, the multilayer capacitor C1 includes few paths through which moisture infiltrates, as compared with a configuration in which the conductive resin layer covers the entire end surface $3e$, the one part of each of the principal surfaces $3a$ and $3b$, and the one part of each of the pair of side surfaces $3c$. Consequently, the multilayer capacitor C1 improves moisture resistance reliability.

The multilayer capacitor C1 may be mounted on the electronic device in such a manner that the principal surface $3a$ is arranged to constitute the mounting surface, or may be mounted on the electronic device in such a manner that the principal surface $3b$ is arranged to constitute the mounting surface. Therefore, the multilayer capacitor C1 has no directionality at the mounting of the multilayer capacitor C1, and improves workability of mounting.

The multilayer capacitor C1 includes the plurality of internal electrodes 7 and 9 exposed to the corresponding end surface $3e$. The external electrode 5 includes the first electrode layer E1 (first electrode layer E1 included in the electrode portion $5e$) formed on the end surface $3e$ to be connected to the corresponding internal electrodes 7 and 9. In this case, the external electrode 5 (first electrode layer E1) and the internal electrodes 7 and 9 that correspond to each other are favorably in contact with each other. Therefore, the multilayer capacitor C1 allows reliable electrical connection between the external electrode 5 and the internal electrodes 7 and 9 that correspond to each other.

In the multilayer capacitor C1, the first electrode layer E1 (first electrode layer E1 included in the electrode portion $5e$) includes the region covered with the second electrode layers $E2_1$ and $E2_2$ (second electrode layers $E2_1$ and $E2_2$ included in the electrode portion $5e$) and the region exposed from the second electrode layers $E2_1$ and $E2_2$ (second electrode layers $E2_1$ and $E2_2$ included in the electrode portion $5e$). Electric resistance of each of the second electrode layers $E2_1$ and $E2_2$ is larger than electric resistance of the first electrode layer E1. The region exposed from the second electrode layers $E2_1$ and $E2_2$ in the first electrode layer E1 is electrically connected to the electronic device without passing through the second electrode layers $E2_1$ and $E2_2$. Therefore, the multilayer capacitor C1 suppresses an increase in ESR even in a case in which the external electrode 5 includes the second electrode layers $E2_1$ and $E2_2$.

In the multilayer capacitor C1, the external electrode 5 includes the third electrode layer E3 and fourth electrode layer E4. Therefore, the multilayer capacitor C1 can be solder-mounting on the electronic device.

The third electrode layer E3 and fourth electrode layer E4 cover the second electrode layers $E2_1$ and $E2_2$ and the region exposed from the second electrode layers $E2_1$ and $E2_2$ in the first electrode layer E1 The region exposed from the second electrode layers $E2_1$ and $E2_2$ in the first electrode layer E1 is electrically connected to the electronic device via the third electrode layer E3 and fourth electrode layer E4. Therefore, the multilayer capacitor C1 further suppresses the increase in the ESR.

In the multilayer capacitor C1, the first electrode layer E1 also covers the ridge portion 3i. The one part of portion of the first electrode layer E1 formed the ridge portion 3i is exposed from the second electrode layers $E2_1$ and $E2_2$. The one part of portion of the first electrode layer E1 formed on the ridge portion 3i includes, for example, the first electrode layer E1 included in the region $5c_1$. Therefore, the multilayer capacitor C1 further suppresses the increase in ESR.

In the multilayer capacitor C1, when viewed from the third direction, the height $H2_1$ of the second electrode layer $E2_1$ and the height $H2_2$ of the second electrode layer E2, are larger than the interval G1 between the second electrode layer $E2_1$ and the second electrode layer $E2_2$. Therefore, the multilayer capacitor C1 reliably suppresses the occurrence of a crack in the element body 3.

The bonding strength between the second electrode layers $E2_1$ and $E2_2$ and the element body 3 is smaller than the bonding strength between the second electrode layers $E2_1$ and $E2_2$ and the first electrode layer E1. Therefore, the second electrode layers $E2_1$ and $E2_2$ may peel off from the element body 3.

In the multilayer capacitor C1, the first electrode layer E1 is formed on the ridge portions 3g and 3i. Therefore, even in a case in which the second electrode layer $E2_1$ peels off from the element body 3, the peel-off of the second electrode layer $E2_1$ tends not to develop to a position corresponding to the end surface 3e beyond a position corresponding to the ridge portions 3g and 3i. The first electrode layer E1 is formed on the ridge portions 3h and 3i. Therefore, even in a case in which the second electrode layer $E2_2$ peels off from the element body 3, the peel-off of the second electrode layer $E2_2$ tends not to develop to a position corresponding to the end surface 3e beyond a position corresponding to the ridge portions 3h and 3i.

In the multilayer capacitor C1, the second electrode layer $E2_1$ (second electrode layer $E2_1$ included in the electrode portions 5a and 5c) is formed to cover the one part of the portion of the first electrode layer E1 formed on the ridge portion 3i and the entire portion of the first electrode layer E1 formed on the ridge portion 3g. The one part of portion of the first electrode layer E1 formed on the ridge portion 3i includes, for example, the first electrode layer E1 in the region $5c_2$. Therefore, the peel-off of the second electrode layer $E2_1$ tends not to develop to the position corresponding to the end surface 3e. The second electrode layer $E2_2$ (second electrode layer $E2_2$ included in the electrode portions 5b and 5c) is formed to cover the one part of the portion of the first electrode layer E1 formed on the ridge portion 3i and the entire portion of the first electrode layer E1 formed on the ridge portion 3h. The one part of portion of the first electrode layer E1 formed on the ridge portion 3i includes, for example, the first electrode layer E1 in the region $5c_3$. Therefore, the peel-off of the second electrode layer $E2_2$ tends not to develop to the position corresponding to the end surface 3e.

The stress generated in the element body due to the external force applied onto the multilayer capacitor C1 from the electronic device tends to concentrate on the end edge of the first electrode layer E1. Therefore, a crack may occur in the element body 3 with the end edge of the first electrode layer E1 serving as an origination of the crack.

The second electrode layer $E2_1$ covers the one part of the portion of the first electrode layer E1 formed on the ridge portion 3i and the entire portion of the first electrode layer E1 formed on the ridge portion 3g. The portion of the first electrode layer E1 formed on the ridge portion 3i partially includes, for example, the first electrode layer E1 in the region $5c_2$. Therefore, when the principal surface 3a is the mounting surface, the stress hardly concentrates on the end edge of the first electrode layer E1.

The second electrode layer $E2_2$ covers one part of the portion of the first electrode layer E1 formed on the ridge portion 3i (first electrode layer E1 in the region $5c_3$) and the entire portion of the first electrode layer E1 formed on the ridge portion 3h. The portion of the first electrode layer E1 formed on the ridge portion 3i partially includes, for example, the first electrode layer E1 in the region $5c_3$. Therefore, when the principal surface 3b is the mounting surface, the stress hardly concentrates on the end edge of the first electrode layer E1.

Consequently, in the multilayer capacitor C1, the occurrence of a crack in the element body 3 is reliably suppressed.

In the multilayer capacitor C1, the second electrode layer $E2_1$ is in contact with the one part of the ridge portion 3j. Therefore, in a case in which the principal surface 3a is arranged to constitute the mounting surface, a crack tends not to occur on the one part of the ridge portion 3j. The second electrode layer $E2_1$ reliably covers the first electrode layer E1, and thus the second electrode layer $E2_1$ relaxes the stress generated in the first electrode layer E1.

The second electrode layer $E2_2$ is in contact with the one part of the ridge portion 3k. Therefore, in a case in which the principal surface 3b is arranged to constitute the mounting surface, a crack tends not to occur on the one part of the ridge portion 3k. The second electrode layer $E2_2$ reliably covers the first electrode layer E1, and thus the second electrode layer $E2_2$ relaxes the stress generated in the first electrode layer E1.

Figure 11:
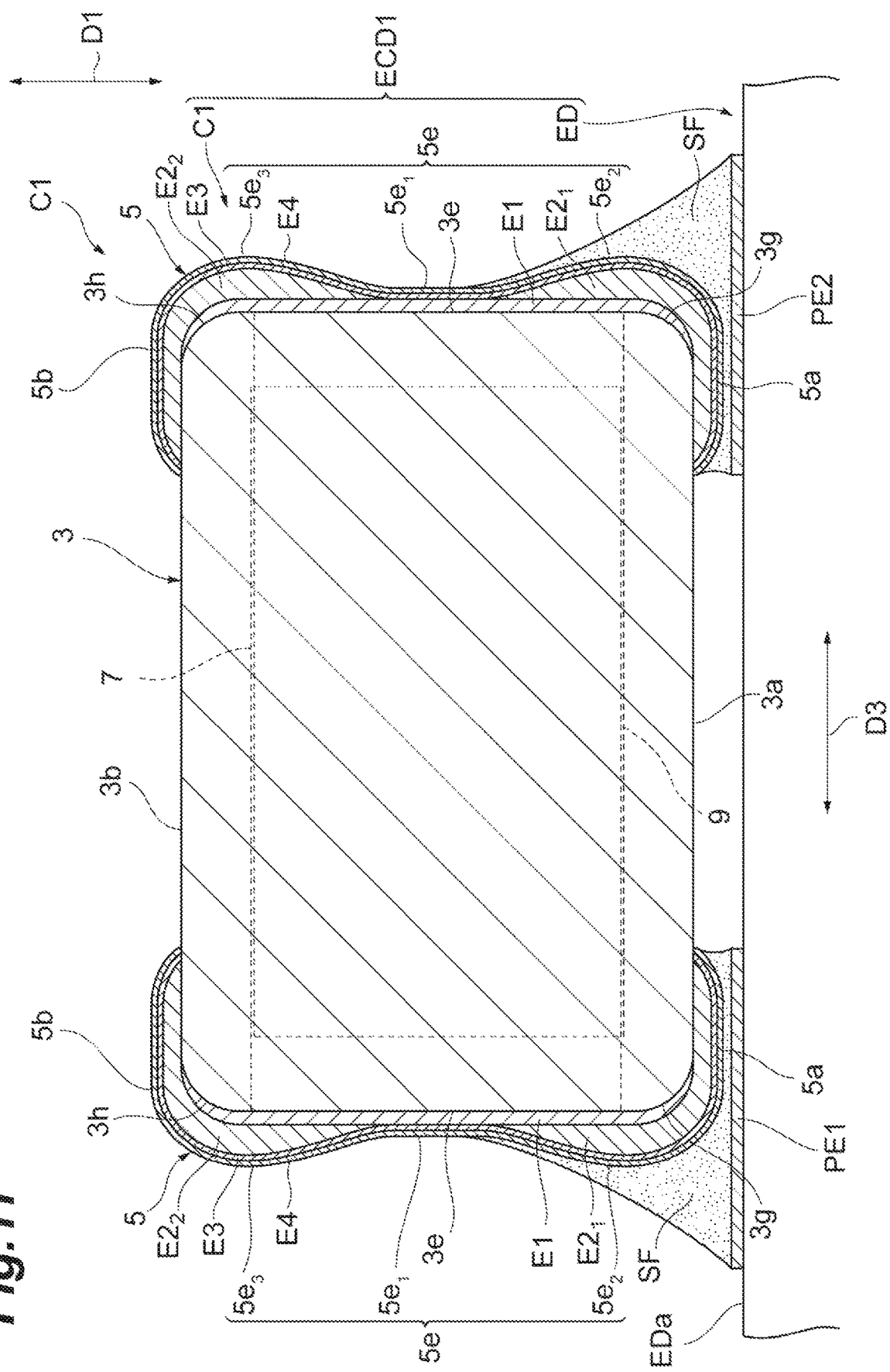
FIG. 11 is a view illustrating a mounting structure of the multilayer capacitor according to the embodiment.

Next, a mounted structure of the multilayer capacitor C1 will be described with reference to FIG. 11. FIG. 11 is a view illustrating a mounted structure of a multilayer capacitor according to the embodiment.

As illustrated in FIG. 11, an electronic component device ECD1 includes the multilayer capacitor C1 and an electronic device ED. The electronic device ED includes, for example, a circuit board or an electronic component. The multilayer capacitor C1 is solder-mounted on the electronic device ED. The electronic device ED includes a principal surface EDa and a plurality of pad electrodes PE1 and PE2. In the present embodiment, the electronic device ED includes two pad electrodes PE1 and PE2. Each of the pad electrodes PE1 and PE2 is disposed on the principal surface EDa. The two pad electrodes PE1 and PE2 are separated from each other. The multilayer capacitor C1 is disposed on the electronic device ED in such a manner that the principal surface 3a and the principal surface EDa oppose each other. As described above, the principal surface $3a$ is arranged to constitute a mounting surface. The multilayer capacitor C1 may be disposed on the electronic device ED in such a manner that the principal surface $3b$ and the principal surface EDa oppose each other.

When the multilayer capacitor C1 is solder-mounted, molten solder wets to the external electrodes 5 (fourth electrode layer E4). Solder fillets SF are formed on the external electrodes 5 by solidification of the wet solder. The external electrodes 5 and the pad electrodes PE1 and PE2 corresponding to each other are coupled via the solder fillets SF. The solder fillet SF is formed on the regions $5e_1$ and $5e_2$ of the electrode portion $5e$. In addition to the region $5e_2$, the region $5e_1$ that does not include the second electrode 1 layers $E2_1$ and $E2_2$ is also coupled to the corresponding pad electrode PE1 or PE2 via the solder fillet SF.

When viewed from the third direction D3, the solder fillet SF overlaps the region $5e_1$ of the electrode portion $5e$. When viewed from the third direction D1, the solder fillet SF overlaps the first electrode layer E1 included in the region $5e_1$. Although illustration is omitted, the solder fillets SF are also formed on the regions $5c_1$ and $5c_2$ of the electrode portion $5c$. A height of the solder fillet SF in the first direction D1 is larger than a height of the second electrode layer $E2_1$ in the first direction D1. The solder fillet SF extends in the first direction D1 to be closer to the principal surface $3b$ than the end edge $E2e_1$ of the second electrode layer $E2_1$. When viewed from the third direction D3, the solder fillet SF may overlap the region $5e_3$ of the electrode portion $5e$. In this case, the solder fillet SF is also formed on the region $5e_3$ of the electrode portion $5e$.

As described above, the electronic component device ECD1 suppresses occurrence of a crack in the element body 3, and improves moisture resistance reliability.

In the electronic component device ECD1, when viewed from the third direction D3, the solder fillet SF overlaps the region $5e_1$ of the electrode portion $5e$. The region $5e_1$ is electrically connected to the electronic device ED via the solder fillet SF. The region $5e_1$ is electrically connected to the electronic device ED without passing through the second electrode layers $E2_1$ and $E2_2$. Therefore, even in a case in which the external electrode 5 includes the second electrode layers $E2_1$ and $E2_2$, the electronic component device ECD1 suppresses an increase in ESR.

Figure 12:
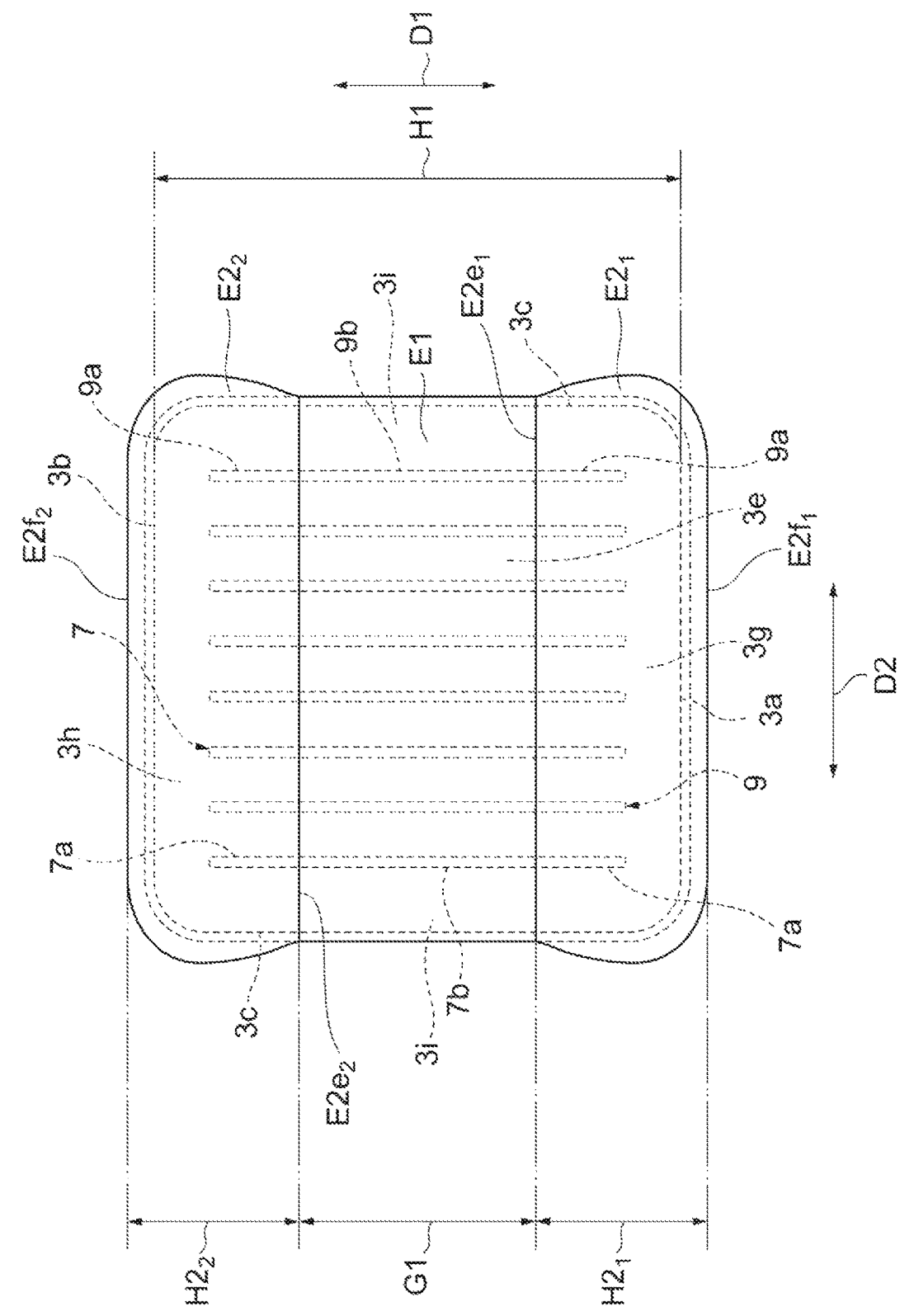
FIG. 12 is an end view illustrating the element body, the first electrode layer, and the second electrode layer.
Figure 13:
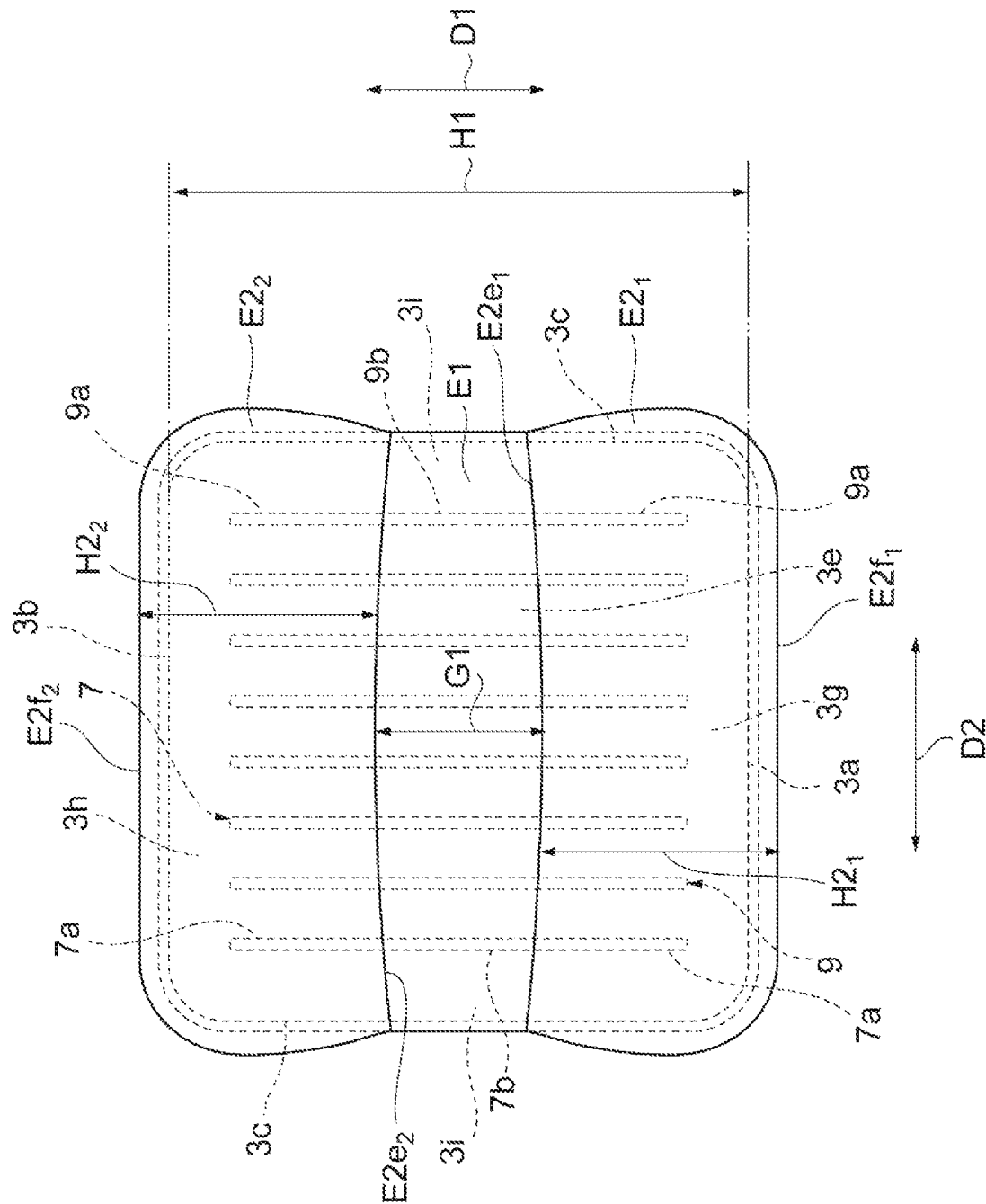
FIG. 13 is an end view illustrating the element body, the first electrode layer, and the second electrode layer.
Figure 14:
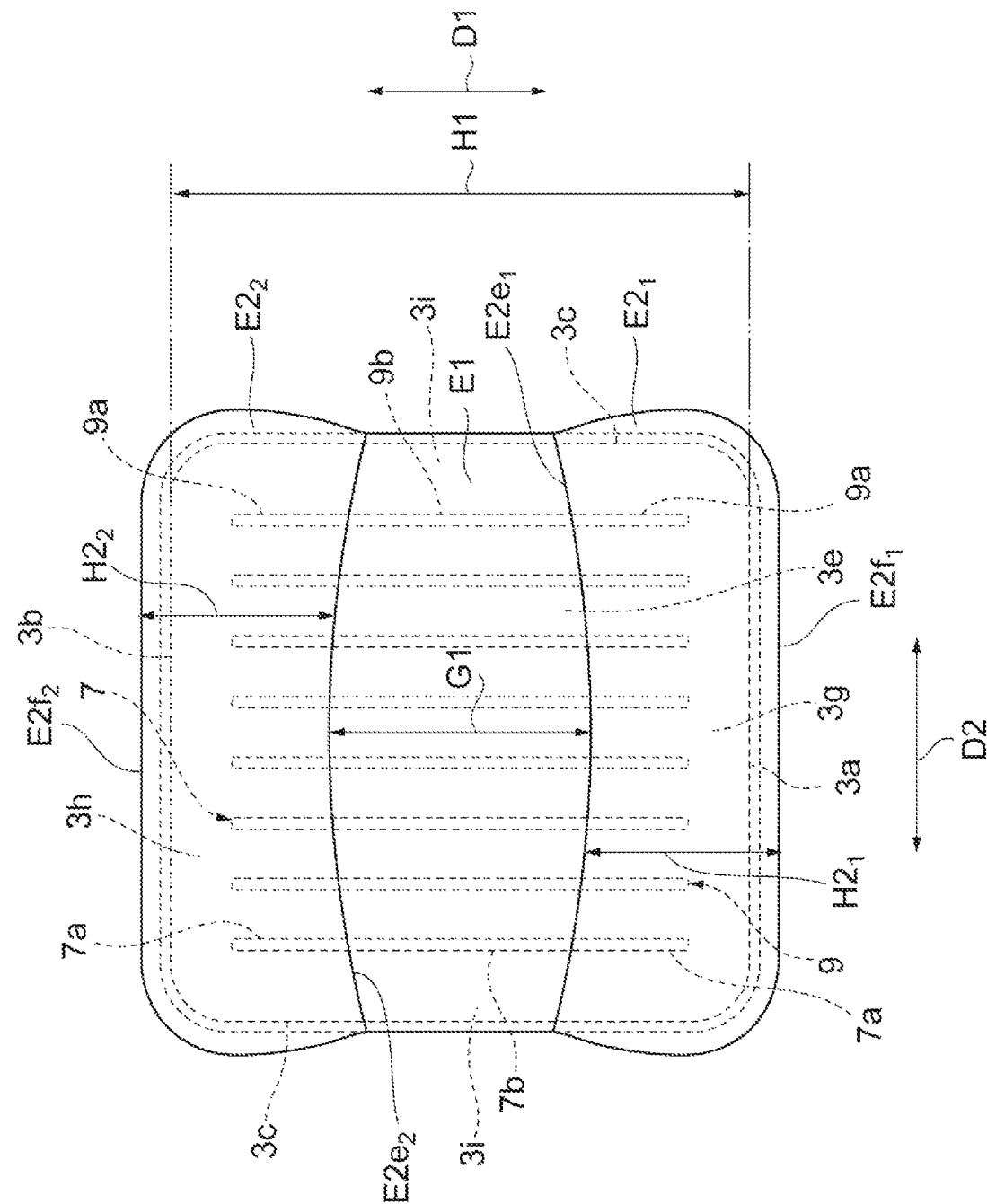
FIG. 14 is an end view illustrating the element body, the first electrode layer, and the second electrode layer.

Next, a configuration of a multilayer capacitor according to a modification of the present embodiment will be described with reference to FIGS. 12 to 14. FIGS. 12 to 14 are end views illustrating an element body, a first electrode layer, and a second electrode layer. In the modifications illustrated in FIGS. 12 to 14, a shape of the second electrode layer $E2_1$ included in the region $5e_2$ and a shape of the second electrode layer $E2_2$ included in the region $5e_3$ are different from those in the multilayer capacitor C1. Hereinafter, differences between the multilayer capacitor C1 and the modification will be mainly described.

In the modification illustrated in FIG. 12, when viewed from a third direction D3, an interval G1 between the second electrode layer $E2_1$ and the second electrode layer $E2_2$ in the first direction D1 is larger than a height $H2_1$ of the second electrode layer $E2_1$ in the first direction D1 and is larger than a height $H2_2$ of the second electrode layer $E2_2$ in the first direction D1. This configuration further suppresses an increase in ESR.

In each of the modifications illustrated in FIGS. 13 and 14, when viewed from the third direction D3, the height $H2_1$ of the second electrode layer $E2_1$ in the first direction D1 is larger at the end in a second direction D2 than at the center in the second direction D2. The height $H2_1$ of the second electrode layer $E2_1$ gradually increases as it goes away from the center toward the end in the second direction D2. When viewed from the third direction D3, an end edge $E2e_1$ of the second electrode layer $E2_1$ has an approximately arc shape. When viewed from the third direction D3, the end edge $E2e_1$ of the second electrode layer $E2_1$ has a concave curved shape bent in a direction from a principal surface $3b$ toward a principal surface $3a$. The height $H2_2$ of the second electrode layer $E2_2$ in the first direction D1 is also larger at the end in the second direction D2 than at the center in the second direction D2. The height $H2_2$ of the second electrode layer $E2_2$ gradually increases with an increase in distance from the center toward the end in the second direction D2. When viewed from the third direction D3, an end edge $E2e_2$ of the second electrode layer $E2_2$ has an approximately arc shape. When viewed from the third direction D3, the end edge $E2e_2$ of the second electrode layer $E2_2$ has a concave curved shape bent in the direction from the principal surface $3a$ toward the principal surface $3b$.

In each of the modifications illustrated in FIGS. 13 and 14, when viewed from the third direction D3, the height $H2_1$ of the second electrode layer $E2_1$ is larger at the end in the second direction D2 than at the center in the second direction D2. Therefore, the second electrode layer $E2_1$ tends not to peel off from an element body 3. The height $H2_2$ of the second electrode layer $E2_2$ is larger at the end in the second direction D2 than at the center in the second direction D2. Therefore, the second electrode layer $E2_2$ tends not to peel off from the element body 3.

In the modification illustrated in FIG. 13, when viewed from the third direction D3, an average value of the height $H2_1$ of the second electrode layer $E2_1$ and an average value of the height $H2_2$ of the second electrode layer $E2_2$ are larger than an average value of the interval G1. Therefore, the modification illustrated in FIG. 13 reliably suppresses occurrence of a crack in the element body 3, as described above. In the modification illustrated in FIG. 14, when viewed from the third direction D3, the average value of the interval G1 is larger than the average value of the height $H2_1$ of the second electrode layer $E2_1$, and is also larger than the average value of the height $H2_2$ of the second electrode layer $E2_2$. Therefore, the modification illustrated in FIG. 13 further suppresses an increase in ESR, as described above.

Although the embodiments and modifications of the present invention have been described above, the present invention is not necessarily limited to the embodiments and modifications, and the embodiment can be variously changed without departing from the scope of the invention.

The first electrode layer E1 may be formed on the principal surface $3a$ to extend over the ridge portion $3g$ entirely or partially from the end surface $3e$. The first electrode layer E1 may be formed on the principal surface $3b$ to extend beyond the ridge portion $3h$ entirely or partially from the end surface $3e$. In a case in which the first electrode layer E1 is formed on the principal surface $3b$, an electrode portion disposed on the principal surface $3b$ may be four-layered. The first electrode layer E1 may be formed on the side surface $3c$ to extend beyond the ridge portion $3i$ entirely or partially from the end surface $3e$. In a case in which the first electrode layer E1 is formed on the side surface $3c$, an electrode portion disposed on the side surface $3c$ may be four-layered.

The height $H2_1$ of the second electrode layer $E2_1$, the height $H2_2$ of the second electrode layer $E2_2$, and the interval G1 may be equivalent to each other. The average value of the height $H2_1$ of the second electrode layer $E2_1$, the average value of the height $H2_2$ of the second electrode layer $E2_2$, and the average value of the interval G1 may be equivalent to each other. The number of internal electrodes 7 and 9 included in the multilayer capacitor C1 is not limited to the number of the internal electrodes 7 and 9 illustrated in FIGS. 4 to 6. In the multilayer capacitor C1, the number of the internal electrodes connected to one external electrode 5 (first electrode layer E1) may be one.

The electronic component of the embodiment and the modifications are the multilayer capacitor C1. Applicable electronic component is not limited to the multilayer capacitor. Examples of the applicable electronic components include, but not limited to, multilayer electronic components such as a multilayer feedthrough capacitor, a multilayer inductor, a multilayer varistor, a multilayer piezoelectric actuator, a multilayer thermistor, or a multilayer composite component, and electronic components other than the multilayer electronic components.

What is claimed is:

1. An electronic component, comprising:
    an element body of a rectangular parallelepiped shape including first and second principal surfaces opposing each other in a first direction, a pair of side surfaces opposing each other in a second direction, and a pair of end surfaces opposing each other in a third direction; and
    a plurality of external electrodes disposed at both end portions of the element body in the third direction, wherein
    each of the external electrodes includes:
    a first conductive resin layer continuously covering one part of the first principal surface, one part of the end surface, and one part of each of the pair of side surfaces; and
    a second conductive resin layer separated from the first conductive resin layer, the second conductive resin layer continuously covering one part of the second principal surface, one part of the end surface, and one part of each of the pair of side surfaces.

2. The electronic component according to claim 1, further comprising:
    an internal conductor exposed to a corresponding end surface of the pair of end surfaces, wherein
    each of the external electrodes further includes a sintered metal layer formed on the end surface to be connected to the internal conductor.

3. The electronic component according to claim 2, wherein
    the sintered metal layer includes a first region covered with the first conductive resin layer, a second region covered with the second conductive resin layer, and a third region exposed from the first conductive resin layer and the second conductive resin layer.

4. The electronic component according to claim 3, wherein
    each of the external electrodes further includes a plating layer covering the first conductive resin layer, the second conductive resin layer, and the third region of the sintered metal layer.

5. The electronic component according to claim 2, wherein
    the sintered metal layer covers a ridge portion located between the end surface and the side surface, and
    a portion of the sintered metal layer formed on the ridge portion is partially exposed from the first and second conductive resin layers.

6. The electronic component according to claim 2, wherein
    when viewed from the third direction, an interval between the first conductive resin layer and the second conductive resin layer in the first direction is larger than respective heights of the first and second conductive resin layers in the first direction.

7. The electronic component according to claim 6, wherein
    when viewed from the third direction, the respective heights of the first and second conductive resin layers in the first direction are larger at an end in the second direction than at a center in the second direction.

8. The electronic component according to claim 1, wherein
    when viewed from the third direction, respective heights of the first and second conductive resin layers in the first direction are larger than an interval between the first conductive resin layer and the second conductive resin layer in the first direction.

9. The electronic component according to claim 8, wherein
    when viewed from the third direction, the respective heights of the first and second conductive resin layers in the first direction are larger at an end in the second direction than at a center in the second direction.

10. An electronic component device, comprising:
    the electronic component according to claim 1; and
    an electronic device including a plurality of pad electrodes, wherein
    each of the plurality of external electrodes is connected to a corresponding pad electrode of the plurality of pad electrodes via a solder fillet.

11. The electronic component device according to claim 10, wherein
    the electronic component further includes an internal conductor exposed to a corresponding end surface of the pair of end surfaces,
    the external electrode further includes a sintered metal layer formed on the end surface to be connected to the internal conductor,
    the sintered metal layer includes a first region covered with the first conductive resin layer, a second region covered with the second conductive resin layer, and a third region exposed from the first conductive resin layer and the second conductive resin layer, and
    the solder fillet overlaps the third region of the sintered metal layer when viewed from the third direction.

12. An electronic component, comprising:
    an element body of a rectangular parallelepiped shape including first and second principal surfaces opposing each other in a first direction, a pair of side surfaces opposing each other in a second direction, and a pair of end surfaces opposing each other in a third direction; and
    an external electrode disposed at an end portion of the element body in the third direction, wherein
    the external electrode includes:
    a first conductive resin layer continuously covering one part of the first principal surface, one part of the end surface, and one part of each of the pair of side surfaces; and
    a second conductive resin layer separated from the first conductive resin layer, the second conductive resin layer continuously covering one part of the second principal surface, one part of the end surface, and one part of each of the pair of side surfaces.

* * * * *